United States Patent
Fujii et al.

(10) Patent No.: US 9,620,714 B2
(45) Date of Patent: Apr. 11, 2017

(54) METHOD FOR FORMING PATTERN, METHOD FOR MANUFACTURING LIGHT EMITTING DEVICE, AND LIGHT EMITTING DEVICE

(75) Inventors: Gen Fujii, Kanagawa (JP); Erika Takahashi, Kanagawa (JP)

(73) Assignee: Semiconductor Energy Laboratory Co., LTD., Kanagawa-ken (JP)

(*) Notice: Subject to any disclaimer, the term of this patent is extended or adjusted under 35 U.S.C. 154(b) by 117 days.

(21) Appl. No.: 13/213,255

(22) Filed: Aug. 19, 2011

(65) Prior Publication Data
US 2011/0303911 A1 Dec. 15, 2011

Related U.S. Application Data

(62) Division of application No. 12/135,252, filed on Jun. 9, 2008, now Pat. No. 8,017,422.

(30) Foreign Application Priority Data

Jun. 19, 2007 (JP) .................................. 2007-160895

(51) Int. Cl.
*H01L 51/00* (2006.01)
*H01L 21/768* (2006.01)
(Continued)

(52) U.S. Cl.
CPC .... *H01L 51/0005* (2013.01); *H01L 21/76825* (2013.01); *H01L 21/76826* (2013.01);
(Continued)

(58) Field of Classification Search
CPC .................... H01L 51/0005; H01L 21/76285
See application file for complete search history.

(56) References Cited

U.S. PATENT DOCUMENTS 7,015,023 B1 3/2006 Lam et al.
7,015,503 B2* 3/2006 Seki et al. ...................... 257/40
(Continued)

FOREIGN PATENT DOCUMENTS

JP 2000-171629 6/2000
JP 2003-332080 11/2003
(Continued)

OTHER PUBLICATIONS

Korean Office Action (Application No. 2013-0032248) Dated Jul. 8, 2014.

*Primary Examiner* — Jerome Jackson, Jr.
(74) *Attorney, Agent, or Firm* — Nixon Peabody LLP; Jeffrey L. Costellia

(57) ABSTRACT

Oxidation treatment is performed to the surface of a substrate provided with a photocatalytic conductive film and an insulating film; treatment with a silane coupling agent is performed, so that a silane coupling agent film is formed and the surface of the substrate is modified to be liquid-repellent; and the surface of the substrate is irradiated with light of a wavelength (less than to equal to 390 nm) which has energy of greater than or equal to a band gap of a material for forming the photocatalytic conductive film, so that only the silane coupling agent film over the surface of the photocatalytic conductive film is decomposed and the surface of the photocatalytic conductive film can be modified to be lyophilic.

19 Claims, 14 Drawing Sheets

(51) Int. Cl.
*H01L 27/32* (2006.01)
*H01L 51/05* (2006.01)
*H01L 51/56* (2006.01)

(52) U.S. Cl.
CPC ...... *H01L 27/3246* (2013.01); *H01L 27/3283* (2013.01); *H01L 51/0545* (2013.01); *H01L 51/56* (2013.01)

(56) References Cited

U.S. PATENT DOCUMENTS

| | | |
|---|---|---|
| 7,273,773 B2 | 9/2007 | Yamazaki et al. |
| 7,655,566 B2 | 2/2010 | Fujii |
| 8,053,171 B2 | 11/2011 | Maekawa et al. |
| 8,247,965 B2 | 8/2012 | Yamazaki et al. |
| 8,293,457 B2 | 10/2012 | Maekawa et al. |
| 8,624,252 B2 | 1/2014 | Maekawa et al. |
| 2003/0129321 A1 | 7/2003 | Aoki |
| 2005/0064633 A1* | 3/2005 | Mikoshiba ........... B41J 2/14201 438/151 |
| 2005/0074963 A1 | 4/2005 | Fujii et al. |
| 2005/0158665 A1 | 7/2005 | Maekawa et al. |
| 2005/0168140 A1* | 8/2005 | Nakamura et al. ........... 313/506 |
| 2005/0170565 A1 | 8/2005 | Fujii et al. |
| 2005/0221203 A1 | 10/2005 | Fujii |
| 2006/0121745 A1 | 6/2006 | Fujii |
| 2006/0166411 A1 | 7/2006 | Morisue et al. |
| 2006/0249732 A1 | 11/2006 | Shirasaki et al. |
| 2007/0019032 A1 | 1/2007 | Maekawa et al. |
| 2007/0207274 A1 | 9/2007 | Fujii |
| 2008/0012076 A1 | 1/2008 | Yamazaki et al. |

FOREIGN PATENT DOCUMENTS

| | | | |
|---|---|---|---|
| JP | 2004-139879 | | 5/2004 |
| JP | 2005-093691 | | 4/2005 |
| JP | 2006-175308 | | 7/2006 |
| JP | 2006-313652 A | | 11/2006 |
| KR | 2005-0075725 A | | 7/2005 |
| KR | 2007-0014057 A | | 1/2007 |
| WO | WO2005/048222 | * | 5/2005 |

* cited by examiner

FIG. 13A
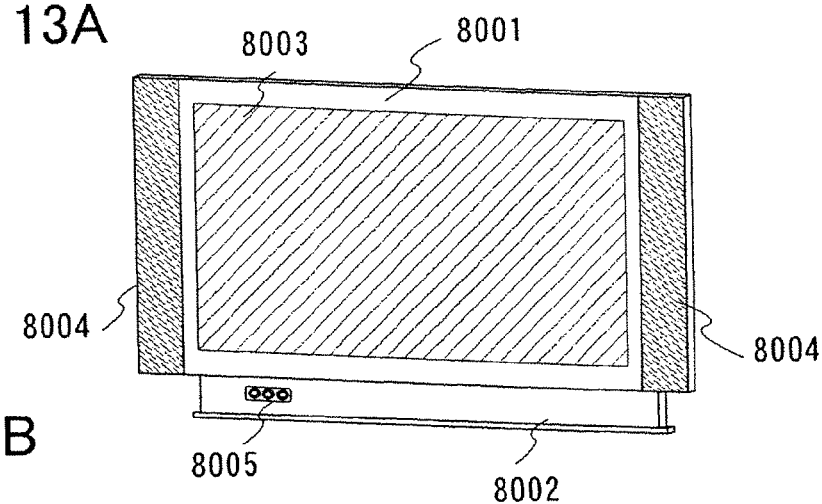
FIG. 13B
FIG. 13C
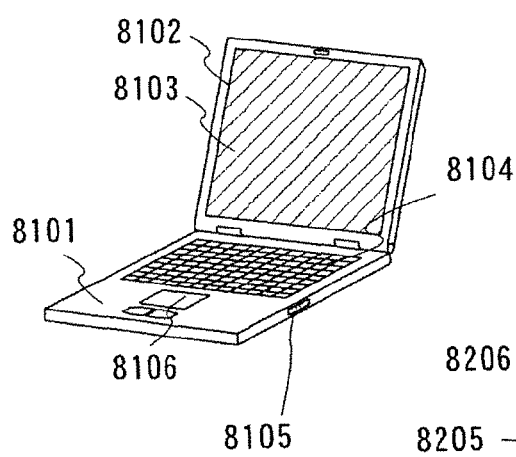
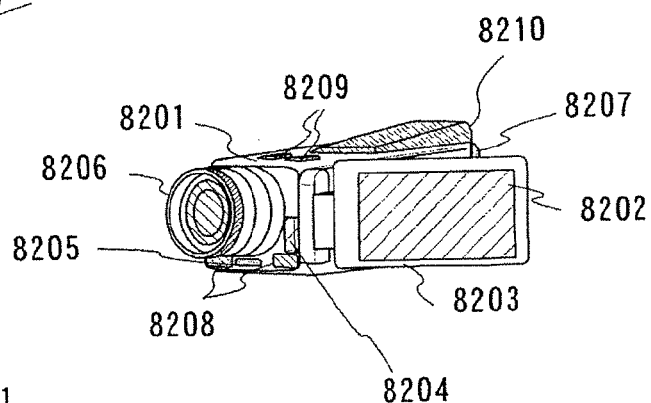
FIG. 13D
FIG. 13E
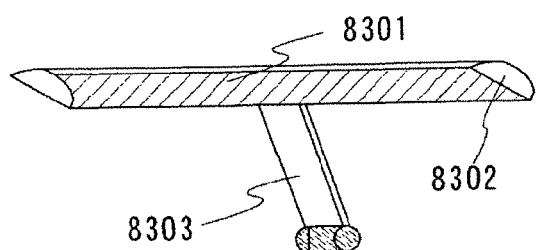
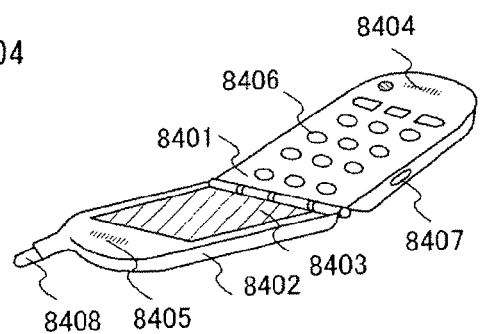

Sample (1)

Sample (2)

Sample (3)

METHOD FOR FORMING PATTERN, METHOD FOR MANUFACTURING LIGHT EMITTING DEVICE, AND LIGHT EMITTING DEVICE

BACKGROUND OF THE INVENTION

1. Field of the Invention

The present invention relates to a method for forming a pattern capable of forming a film as selected by controlling wettability of a surface where the film is to be formed, a method for manufacturing a light emitting device having a light emitting element using the method for forming a pattern, and a light emitting device.

A light emitting element is an element having a structure in which a film containing an organic compound (hereinafter referred to as a layer containing an organic compound) is provided between a pair of electrodes, and fluorescence or phosphorescence can be obtained by application of an electric field.

The light emitting device refers to an image display device, a light emitting device, or a light source (including a lighting device). Further, the light emitting device includes any of the following modules in its category: a module in which a connector such as a flexible printed circuit (FPC), tape automated bonding (TAB) tape, or a tape carrier package (TCP) is attached to a light emitting device; a module having TAB tape or a TCP provided with a printed wiring board at the end thereof; and a module having an integrated circuit (IC) directly mounted on a light emitting device by a chip on glass (COG) method.

2. Description of the Related Art

A droplet-discharging method such as an ink-jet method has been used as a method for forming a pattern. In this method, specifically, droplets of a liquid material containing a material for forming a pattern are discharged to a desired position to form a pattern, and various patterns can be formed without using a photolithography process or the like. Thus, a droplet-discharging method has an advantage that consumption of the material can be suppressed to the minimum.

When a pattern is formed by a droplet-discharging method, in order to improve accuracy in applying a liquid material to a part where a film is to be formed, a method in which only the part where a film is to be formed over the substrate is modified to be lyophilic and other parts are modified to be liquid-repellent is used.

As one example of the above method, a method for forming a pattern is known, in which, after fluoroalkylsilane (FAS) or the like is applied to the entire surface of a substrate so that the entire surface is modified to be liquid-repellent, only a part where a film is to be formed is irradiated with ultraviolet rays using a metal mask, and the part where a film is to be formed is modified to be lyophilic (for example, refer to Reference 1: Japanese Published Patent Application No. 2005-93691).

In addition, as another example, a method for forming a pattern is known, in which, when a layer containing an organic compound of a light emitting element is formed as a pattern, a layer containing a photocatalyst which includes photocatalytic particles and a binder is formed over one electrode, only the electrode is irradiated with light in pattern to decompose active constituents of the binder, and only the surface of the electrode is modified to be lyophilic, so that the layer containing an organic compound is formed over the electrode (for example, refer to Reference 2: Japanese Published Patent Application No. 2003-332080).

However, these methods have problems in that a specific metal mask is necessary so that light irradiation is partially performed, and the number of manufacturing steps is increased since a photolithography technique is used for irradiation in pattern. Further, in the latter example, there are also problems in that when the amount of the binder is increased to smooth the layer containing a photocatalyst, constituents of the binder with an insulating property remain on the electrode which is modified to be lyophilic, and electric characteristics of the light emitting element are degraded.

SUMMARY OF THE INVENTION

It is an object of the present invention to provide a method for forming a pattern in which accuracy in formation of a pattern using a droplet-discharging method is improved by controlling characteristics of a surface where a film is to be formed, a specific metal mask is not used, the number of manufacturing steps is not increased, and further, characteristics of an element that is formed is not adversely affected; a method for manufacturing a light emitting device; and a light emitting device.

The present invention provides a method for forming a pattern in which a liquid-repellent part and a lyophilic part can be separately formed at the same time over the surface where the film is to be formed.

In the above method for forming a pattern, specifically, oxidation treatment is performed to the surface of a substrate provided with a conductive film having a photocatalytic property (hereinafter referred to as a photocatalytic conductive film) and an insulating film; treatment with a silane coupling agent is performed, so that a silane coupling agent film is formed and the surface of the substrate is modified to be liquid-repellent; and the surface of the substrate is irradiated with light of a wavelength (less than or equal to 390 nm) which has energy of greater than or equal to a band gap of a material for forming the photocatalytic conductive film, so that only the silane coupling agent film over the surface of the photocatalytic conductive film is decomposed and only the surface of the photocatalytic conductive film can be modified to be lyophilic. Accordingly, a solution can be applied to the surface of the photocatalytic conductive film as selected.

In the present invention, the treatment with a silane coupling agent refers to treatment in which a substrate to be treated is exposed to an atmosphere containing a silane coupling agent, or treatment in which a silane coupling agent is applied to the substrate to be treated.

Typical examples of the silane coupling agent include fluoroalkylsilane (FAS). Note that fluoroalkylsilane is represented by the chemical formula: $R_n$—Si—$X_{(4-n)}$ (n=1, 2, 3). R is a fluoroalkyl group and has a structure represented by $(CF_3)(CF_2)x(CH_2)y$ (x is an integer of 0 to 10, inclusive, and y is an integer of 0 to 4, inclusive). X represents a hydrolyzable group such as a methoxy group, an ethoxy group, an acetoxy group, or a halogen atom. When a plurality of R or X is bonded to Si, the Rs or Xs may be the same or different.

One aspect of the present invention is a method for forming a pattern, including: forming a photocatalytic conductive film over a substrate, forming an insulating film over the substrate such that the insulating film covers an end portion of the photocatalytic conductive film, performing oxidation treatment to the photocatalytic conductive film and the insulating film; performing treatment with a silane coupling agent to the photocatalytic conductive film and the insulating film, and irradiating the photocatalytic conductive film and the insulating film with light; in which a contact angle of a solution on the surface of the photocatalytic conductive film is less than or equal to 30°, or the contact angle of the solution on the surface of the photocatalytic conductive film is less than or equal to 30° and a difference between the contact angle of the solution on the surface of the photocatalytic conductive film and a contact angle of the solution on the surface of the insulating film is greater than or equal to 20°.

Another aspect of the present invention is a method for manufacturing a light emitting device, including: forming a thin film transistor over a substrate, forming a photocatalytic conductive film electrically connected to the thin film transistor, forming an insulating film over the substrate such that the insulating film covers an end portion of the photocatalytic conductive film, performing oxidation treatment to the photocatalytic conductive film and the insulating film; performing treatment with a silane coupling agent to the photocatalytic conductive film and the insulating film, and irradiating the photocatalytic conductive film and the insulating film with light; in which a contact angle of a solution on the surface of the photocatalytic conductive film is less than or equal to 30°, or the contact angle of the solution on the surface of the photocatalytic conductive film is less than or equal to 30° and a difference between the contact angle of the solution on the surface of the photocatalytic conductive film and a contact angle of the solution on the surface of the insulating film is greater than or equal to 20°. Further, in this method, a solution is applied to the photocatalytic conductive film, and then, a conductive film is formed, so that a light emitting element is formed.

According to the above aspects, when only the surface of the photocatalytic conductive film over the substrate is modified to be lyophilic and then the solution is applied, the solution can be applied to the photocatalytic conductive film as selected.

In the above aspects, the oxidation treatment is treatment in which the photocatalytic conductive film and the insulating film are exposed to active oxygen and ozone which are obtained by irradiating oxygen with ultraviolet rays, or plasma ashing treatment in an oxidizing gas atmosphere.

In each of the above aspects, the photocatalytic conductive film is formed using indium tin oxide, indium zinc oxide which is obtained by mixing zinc oxide of 2% to 20% inclusive into indium oxide, indium tin oxide containing silicon oxide as a constituent, indium oxide doped with tin, zinc oxide, zinc oxide doped with aluminum, zinc oxide doped with gallium, titanium oxide, tin oxide, or the like.

In the above aspects, as a solvent contained in the solution, toluene, benzene, chlorobenzene, dichlorobenzene, chloroform, tetralin, xylene, anisole, dichloromethane, γ-butyl lactone, butyl cellsolve, cyclohexane, NMP (N-methyl-2-pyrrolidone), dimethyl sulfoxide, cyclohexanone, dioxane, THF (tetrahydrofuran), water, or the like can be given.

In the present invention, when a solution is applied in forming a light emitting element, part or all of a layer containing an organic compound included in the light emitting element is formed by application of the solution. Therefore, the solution may include a material for forming the layer containing an organic compound, e.g., any of a light emitting material, a hole injecting material, a hole transporting material, an electron transporting material, and an electron injecting material.

Further, the present invention also includes a light emitting device manufactured with the above aspects.

According to the present invention, a pattern can be formed easily with high accuracy without using a specific metal mask and increasing the number of manufacturing steps by forming a liquid-repellent part and a lyophilic part as selected on a surface where a film is to be formed. Thus, loss of a material can be reduced. In addition, since a metal mask or a photolithography process for forming a pattern is not necessary, the process can be simplified, and the low cost can be achieved.

BRIEF DESCRIPTION OF THE DRAWINGS

FIGS. 13A to 13E are views showing examples of electronic appliances.

DETAILED DESCRIPTION OF THE INVENTION

Hereinafter, embodiment modes of the present invention will be described in detail with reference to the accompanying drawings. Note that the present invention is not limited to the following description, and modes and details thereof can be modified in various ways without departing from the spirit and the scope of the present invention. Therefore, the present invention should not be interpreted as being limited to the following description of the embodiment modes.

(Embodiment Mode 1)

Embodiment Mode 1 will describe, as a method for forming a pattern of the present invention, a method for manufacturing a light emitting element in which a liquid-repellent part and a lyophilic part are separately formed over the surface of a substrate.

Figure 1A:
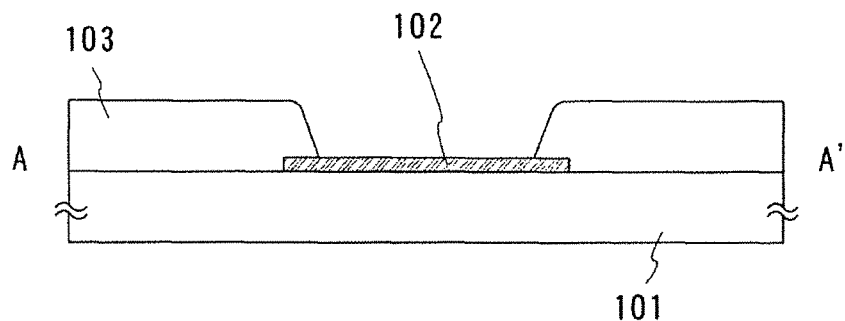
FIGS. 1A to 1D are explanatory views of a method for forming a pattern of the present invention.

A photocatalytic conductive film 102 is formed over a substrate 101 as shown in FIG. 1A. Note that the photocatalytic conductive film 102 functions as one of electrodes of a light emitting element which is formed later.

For the substrate 101, a glass substrate, a quartz substrate, a substrate formed of an insulating substance such as ceramics, e.g., alumina, a plastic substrate, a silicon wafer, a metal plate, or the like can be used. In addition, for the photocatalytic conductive film 102, indium tin oxide (ITO), indium zinc oxide (IZO) which is obtained by mixing zinc oxide (ZnO) of 2% to 20% inclusive into indium oxide, indium tin oxide containing silicon oxide as a constituent, indium oxide doped with tin, zinc oxide (ZnO), zinc oxide doped with aluminum or gallium (AlZnO or GaZnO), titanium oxide ($TiO_x$), tin oxide ($SnO_2$), or the like can be used.

The photocatalytic conductive film 102 is formed by a sputtering method, a CVD method, an evaporation method, a droplet-discharging method, an ink-jet method, a spin-coating method, or the like and patterned into a desired shape by a photolithography method or the like. The thickness thereof is preferably 10 nm to 500 nm, inclusive.

In addition, an insulating film 103 is formed to cover the substrate 101 and an end portion of the photocatalytic conductive film 102. Note that the insulating film 103 can be formed using a film formed of an inorganic material such as silicon oxide, silicon nitride, silicon oxynitride, or silicon nitride oxide, or a film formed of an organic material such as an acrylic resin, a polyimide resin, a polyamide resin, or a siloxane (including a skeleton structure formed by the bond of silicon (Si) and oxygen (O)) resin.

Figure 1B:
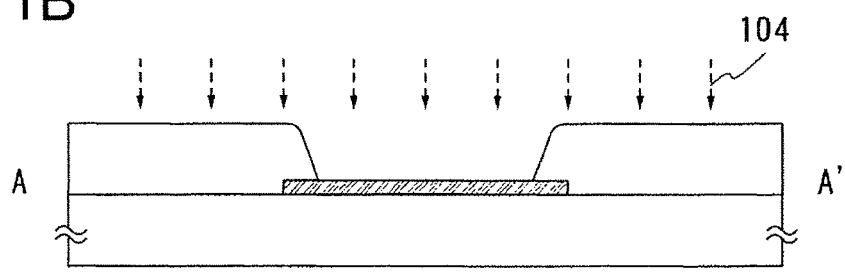

Next, the photocatalytic conductive film 102 and the insulating film 103 over the substrate 101 are irradiated with ultraviolet rays 104 in an oxygen atmosphere so that oxidation treatment is performed to both the films (FIG. 1B). Note that ashing treatment may also be performed in an oxygen atmosphere as the oxidation treatment.

Next, treatment with a silane coupling agent is performed to the surfaces of the photocatalytic conductive film 102 and the insulating film 103. One mode of the treatment with a silane coupling agent which is performed to the substrate in FIG. 1B (referred to as a substrate 1103 to be treated) is described with reference to FIG. 11.

Figure 11:
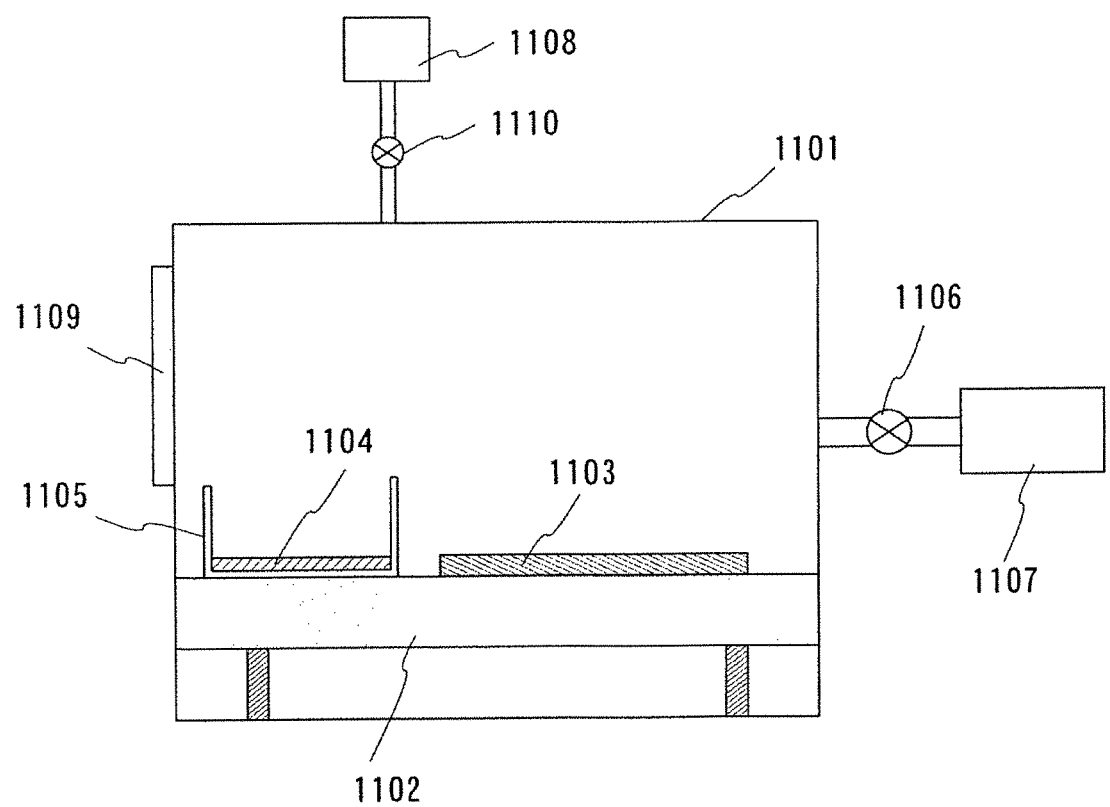
FIG. 11 is an explanatory view of treatment with a silane coupling agent.

In a treatment chamber 1101 shown in FIG. 11, a heater stage 1102 is provided, and the substrate 1103 to be treated and a container 1105 containing a silane coupling agent 1104 which are disposed on the heater stage 1102 are to be heated.

A vacuum pump 1107 is connected to the treatment chamber 1101 via a cock 1106 so that the treatment chamber 1101 is evacuated. In addition, a nitrogen gas 1108 is supplied into the treatment chamber 1101 via a cock 1110.

First, the substrate 1103 to be treated and the container 1105 containing the silane coupling agent 1104 are disposed on the heater stage 1102 in the treatment chamber 1101, and the treatment chamber 1101 is evacuated by the vacuum pump 1107, and then, the nitrogen gas 1108 is supplied.

Next, by heating the heater stage 1102 to 100° C., the silane coupling agent 1104 in the container 1105 is vaporized. The substrate 1103 to be treated is put in vapor of the silane coupling agent 1104, so that the surface of the substrate 1103 to be treated is processed. At this time, in order to prevent condensation from occurring on the wall of the treatment chamber 1101, the treatment chamber 1101 is preferably heated by a heater 1109 which is provided for the treatment chamber 1101.

Figure 1C:
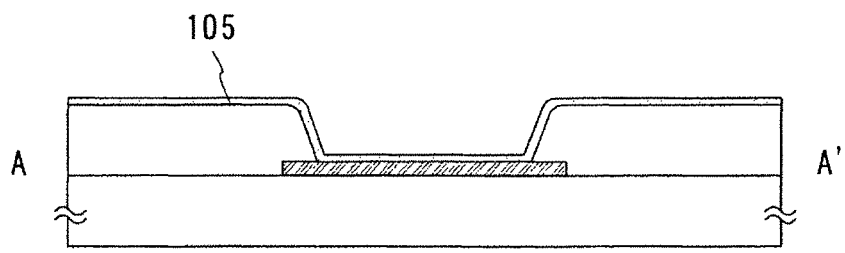

Through the above steps, a silane coupling agent film 105 is formed over the photocatalytic conductive film 102 and the insulating film 103 over the surface of the substrate 1103 to be treated (FIG. 1C). Note that the surface of the silane coupling agent film 105 has a liquid-repellent property.

Typical examples of the silane coupling agent which is used for the treatment with a silane coupling agent include fluoroalkylsilane (FAS). Note that fluoroalkylsilane is represented by the chemical formula: $R_n$—Si—$X_{(4-n)}$ (n=1, 2, 3). R is a fluoroalkyl group and has a structure represented by $(CF_3)(CF_2)x(CH_2)y$ (x is an integer of 0 to 10, inclusive, and y is an integer of 0 to 4, inclusive). X represents a hydrolyzable group such as a methoxy group, an ethoxy group, an acetoxy group, or a halogen atom. When a plurality of R or X is bonded to Si, the Rs or Xs may be the same or different. X becomes silanol by hydrolysis, and the silanol reacts with a hydroxyl group of the surface where the silane coupling agent film is to be formed and is bonded to the surface where the silane coupling agent film is to be formed by the siloxane bond. Meanwhile, R has a fluoro group such as ($CF_3$) on its surface and thus modifies the surface where the silane coupling agent film is to be formed to be liquid-repellent. The silane coupling agent film formed by the treatment with a silane coupling agent is a thin film having a thickness of a single molecule to a thickness of a plurality of molecules.

Specific examples of fluoroalkylsilane include heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltrichlorosilane, tridecafluoro-1,1,2,2-tetrahydrooctyltrimethoxysilane, tridecafluoro-1,1,2,2-tetrahydrooctyltriethoxysilane, and trifluoropropyltrimethoxysilane.

In the treatment with a silane coupling agent, the substrate to be treated may be disposed in an atmosphere where the silane coupling agent is vaporized, so that the silane coupling agent film may be formed over the surface of the substrate. Alternatively, a solution in which the silane coupling agent is diluted with a solvent may be applied to the surface where the silane coupling agent film is to be formed, so that the silane coupling agent film may be formed.

As a solvent which is used when the silane coupling agent is applied as a solution to the surface where the silane coupling agent film is to be formed, n-pentane, n-hexane, n-heptane, n-octane, n-decane, dicyclopentane, benzene, toluene, xylene, tetrahydronaphthalene, decahydronaphthalene, tetrahydrofuran, ethanol, dimethylsulfoxide, or the like can be used.

Figure 1D:
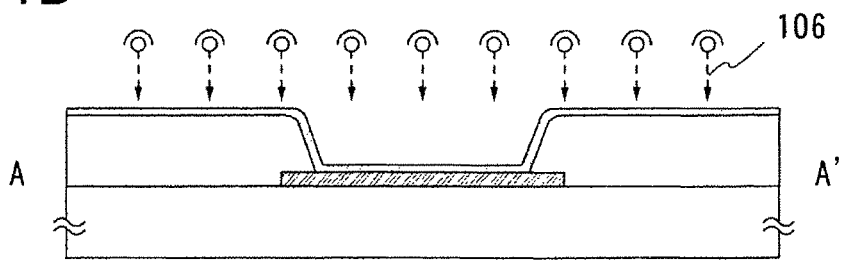

Next, the surface of the silane coupling agent film 105 is irradiated with light 106 (FIG. 1D). For the light 106, light of a wavelength which has energy of greater than or equal to a band gap of a material for forming the photocatalytic conductive film 102, specifically, light of a wavelength of less than or equal to 390 nm is used. For example, if indium tin oxide or zinc oxide is used as the photocatalytic conductive film 102, light of a wavelength of less than or equal to 390 nm may be used, and if tin oxide is used, light of a wavelength of less than or equal to 350 nm may be used.

Figure 2A:
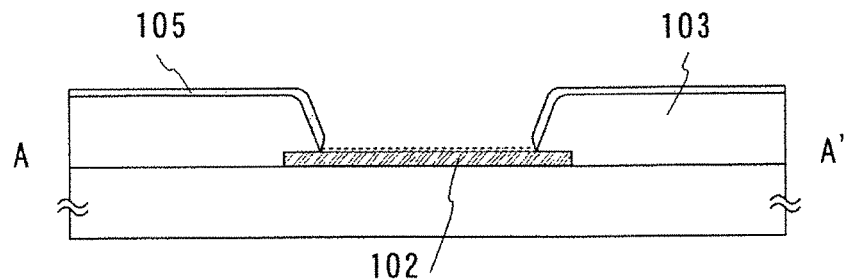
FIGS. 2A to 2D are explanatory views of a method for forming a pattern of the present invention.

By the light irradiation, only the silane coupling agent film formed over the photocatalytic conductive film 102 is decomposed. Since the silane coupling agent film is a thin film as mentioned above, it can be decomposed efficiently. Accordingly, the surface of the photocatalytic conductive film 102 is modified to be lyophilic (FIG. 2A).

Next, a solution containing a material for forming a pattern is applied to the photocatalytic conductive film 102 by a droplet-discharging method, so that a pattern is formed. Note that the surface of the insulating film 103 has a liquid-repellent property since the silane coupling agent film 105 is formed thereover, while the surface of the photocatalytic conductive film 102 has a lyophilic property since the silane coupling agent film 105 over the photocatalytic conductive film 102 is decomposed by the light irradiation. Therefore, it is possible to form a pattern only over the photocatalytic conductive film 102.

In this embodiment mode, as the material for forming a pattern, an organic compound material 109 for forming a layer 110 containing an organic compound of a light emitting element is used, and the layer 110 containing an organic compound is formed by a droplet-discharging method over the photocatalytic conductive film 102.

Figure 2B:
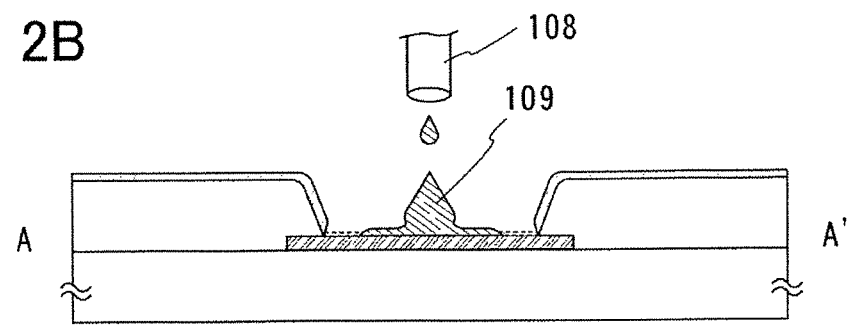

As shown in FIG. 2B, the organic compound material 109 is discharged to the photocatalytic conductive film 102 by use of a droplet-discharging apparatus 108, so that the layer 110 containing an organic compound is formed. The organic compound material 109 is a solution containing a solvent. The layer 110 containing an organic compound is formed by discharging the organic compound material 109 to the photocatalytic conductive film 102, removing the solvent, and solidifying the organic compound material 109. Note that the solvent may be removed by drying or heating. The organic compound material 109 may be discharged under reduced pressure.

In the present invention, it is acceptable as long as at least a layer to be in contact with the photocatalytic conductive film 102, which is included in the layer 110 containing an organic compound, is formed by a droplet-discharging method. The layer 110 containing an organic compound formed over the photocatalytic conductive film 102 may have a single layer structure including one kind of material or a stacked layer structure including plural kinds of materials. When the layer 110 containing an organic compound is formed by a droplet-discharging method, a solution in which a substance that can be used for the layer 110 containing an organic compound is dissolved (or dispersed) in a solvent is used.

The layer 110 containing an organic compound has at least a light emitting layer containing a light emitting substance, and the light emitting substance described here denotes a substance which has favorable luminous efficiency and can emit light of a desired wavelength.

As the light emitting substance contained in the light emitting layer, not only a high-molecular weight light emitting substance (including a middle-molecular weight compound such as oligomer or dendrimer, in addition to polymer,) but also a low-molecular weight light emitting substance can be used. In the case of using a low-molecular weight light emitting substance, a material to be a binder (hereinafter referred to as a binder substance) may be included therein, considering the film quality when forming the film.

As the high-molecular weight light emitting substance, a polyparaphenylene vinylene derivative, a polythiophene derivative, a polyfluorene derivative, a polyparaphenylene derivative, polyalkylphenylene, a polyacetylene derivative, or the like can be given.

Specifically, poly(2,5-dialkoxy-1,4-phenylene vinylene) (RO-PPV); poly(2-dialkoxyphenyl-1,4-phenylene vinylene) (ROPh-PPV); poly(2-methoxy-5-(2-ethyl-hexoxy)-1,4-phenylene vinylene) (MEH-PPV); poly(2,5-dimethyloctylsilyl-1,4-phenylene vinylene) (DMOS-PPV); poly(2,5-dialkoxy-1,4-phenylene) (RO-PPP); poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3-[4-octylphenyl]-2,2'-bithiophene) (PTOPT); poly(3-(4-octylphenyl)-thiophene) (POPT-1); poly(dialkylfluorene) (PDAF); poly(dioctylfluorene) (PDOF); polypropylphenylacetylene (PPA-iPr); poly butylphenylphenylacetylene (PDPA-nBu); polyhexylphenylacetylene (PHPA), or the like can be given.

As a low-molecular weight light emitting substance, the following light emitting substances are effective: tris(8-quinolinolato)aluminum (hereinafter referred to as $Alq_3$); tris(4-methyl-8-quinolinolato)aluminum (hereinafter referred to as $Almq_3$); bis(10-hydroxybenzo[h]-quinolinato) beryllium (hereinafter referred to as $BeBq_2$); bis(2-methyl-8-quinolinolato)-(4-hydroxy-biphenylyl)-aluminum (hereinafter referred to as BAlq); bis[2-(2-hydroxyphenyl)-benzoxazolato]zinc (hereinafter referred to as $Zn(BOX)_2$); bis[2-(2-hydroxyphenyl)-benzothiazolato]zinc (hereinafter referred to as $Zn(BTZ)_2$); 4-dicyanomethylene-2-isopropyl-6-[2-(1,1,7,7-tetramethyl-9-julolidyl)ethenyl]-4H-pyran (hereinafter referred to as DCJTI); 4-dicyanomethylene-2-methyl-6-[2-(1,1,7,7-tetramethyl-9-julolidyl)ethenyl]-4H-pyran (hereinafter referred to as DCJT); 4-dicyanomethylene-2-tert-butyl-6-[2-(1,1,7,7-tetramethyl-9-julolidyl) ethenyl]-4H-pyran (hereinafter referred to as DCJTB); periflanthene; 2,5-dicyano-1,4-bis[2-(10-methoxy-1,1,7,7-tetramethyl-9-julolidyl)ethenyl]-benzene; N,N'-dimethylquinacridone (hereinafter referred to as DMQd); coumarin 6; coumarin 545T; 9,10-bis(2-naphthyl)-tert-butylanthracene (hereinafter referred to as t-BuDNA); 9,9'-bianthryl; 9,10-diphenylanthracene (hereinafter referred to as DPA); 9,10-bis(2-naphthyl)anthracene (hereinafter referred to as DNA); bis(2-methyl-8-quinolinolato)-4-phenylphenolatogallium (hereinafter referred to as BGaq); bis(2-methyl-8-quinolinolato)-4-phenylphenolato-aluminum (hereinafter referred to as BAlq); tris(2-phenylpyridine)iridium (hereinafter referred to as $Ir(ppy)_3$); 2,3,7,8,12,13,17,18-octaethyl-21H,23H-porphyrin-platinum (hereinafter referred to as PtOEP); bis[2-(3,5-bis(trifluoromethyl)phenyl)pyridinato-N,$C^{2'}$] iridium(III)picolinate (hereinafter referred to as $Ir(CF_3ppy)_2(pic)$); bis[2-(4,6-difluorophenyl)pyridinato-N,$C^{2'}$]iridium(III)acetylacetonate (hereinafter referred to as FIr(acac)); bis[2-(4,6-difluorophenyl)pyridinato-N,$C^{2'}$] iridium(III)picolinate (hereinafter referred to as FIr(pic)); and the like.

In addition, as a typical solvent used for such substances, toluene, benzene, chlorobenzene, dichlorobenzene, chloroform, tetralin, xylene, anisole, dichloromethane, γ-butyl lactone, butyl cellsolve, cyclohexane, NMP (N-methyl-2-pyrrolidone), dimethyl sulfoxide, cyclohexanone, dioxane, THF (tetrahydrofuran), water, or the like can be given.

In addition, as the binder substance, polyvinyl alcohol, polymethylmethacrylate, polycarbonate, a phenol resin, or the like can be used.

The light emitting layer may be a layer formed of a substance having a larger energy gap (the energy gap between a LUMO level and a HOMO level) than the energy gap of a light emitting substance, in which the light emitting substance is mixed to be dispersed (that is, a layer containing a host substance and a guest substance). Note that light emission can be prevented from being quenched due to concentration by dispersing a light emitting substance which functions as a guest (also referred to as a guest substance) in a light emitting substance which functions as a host (also referred to as a host substance) in the light emitting layer.

When the light emitting layer is formed by combining a host substance and a guest substance, the light emitting layer may be formed by combining the light emitting substance as described above and the following host substance.

As a specific host substance, the following can be used: tris(8-quinolinolato)aluminum (hereinafter referred to as $Alq_3$); tris(4-methyl-8-quinolinolato)aluminum (hereinafter referred to as $Almq_3$); bis(10-hydroxybenzo[h]-quinolinato) beryllium (hereinafter referred to as $BeBq_2$); bis(2-methyl-8-quinolinolato)-(4-hydroxy-biphenylyl)-aluminum (hereinafter referred to as BAlq); bis[2-(2-hydroxyphenyl)-benzoxazolato]zinc (hereinafter referred to as $Zn(BOX)_2$);

bis[2-(2-hydroxyphenyl)-benzothiazolato]zinc (hereinafter referred to as $Zn(BTZ)_2$); 9,10-bis(2-naphthyl)-tert-butylanthracene (hereinafter referred to as t-BuDNA); 9,10-bis(2-naphthyl)anthracene (hereinafter referred to as DNA); bis(2-methyl-8-quinolinolato)-4-phenylphenolato-gallium (hereinafter referred to as BGaq); 4,4'-di(N-carbazolyl)biphenyl (hereinafter referred to as CBP); 4,4',4''-tri(N-carbazolyl)triphenylamine (hereinafter referred to as TCTA); 2,2',2''-(1,3,5-benzenetriyl)-tris(1-phenyl-1H-benzimidazole) (hereinafter referred to as TPBi); TPAQn; and the like.

Further, a hole injecting layer may be provided in part of the layer 110 containing an organic compound so that holes can be more efficiently injected from an anode. In that case, the hole injecting layer needs to be in contact with an electrode functioning as the anode of the light emitting element, and for example, polyethylene dioxythiophene (hereinafter referred to as PEDOT) doped with polystyrene sulfonate (hereinafter referred to as PSS) or the like can be used.

In addition, the layer 110 containing an organic compound of the present invention may also have a structure including, not only the light emitting layer containing the above-described light emitting substance (light emitting material), any of a hole injecting layer formed of a hole injecting material, a hole transporting layer formed of a hole transporting material, an electron transporting layer formed of an electron transporting material, an electron injecting layer formed of an electron injecting material, and the like. In that case, a known hole injecting material, a known hole transporting material, a known electron transporting material, and a known electron injecting material may be used.

Figure 12:
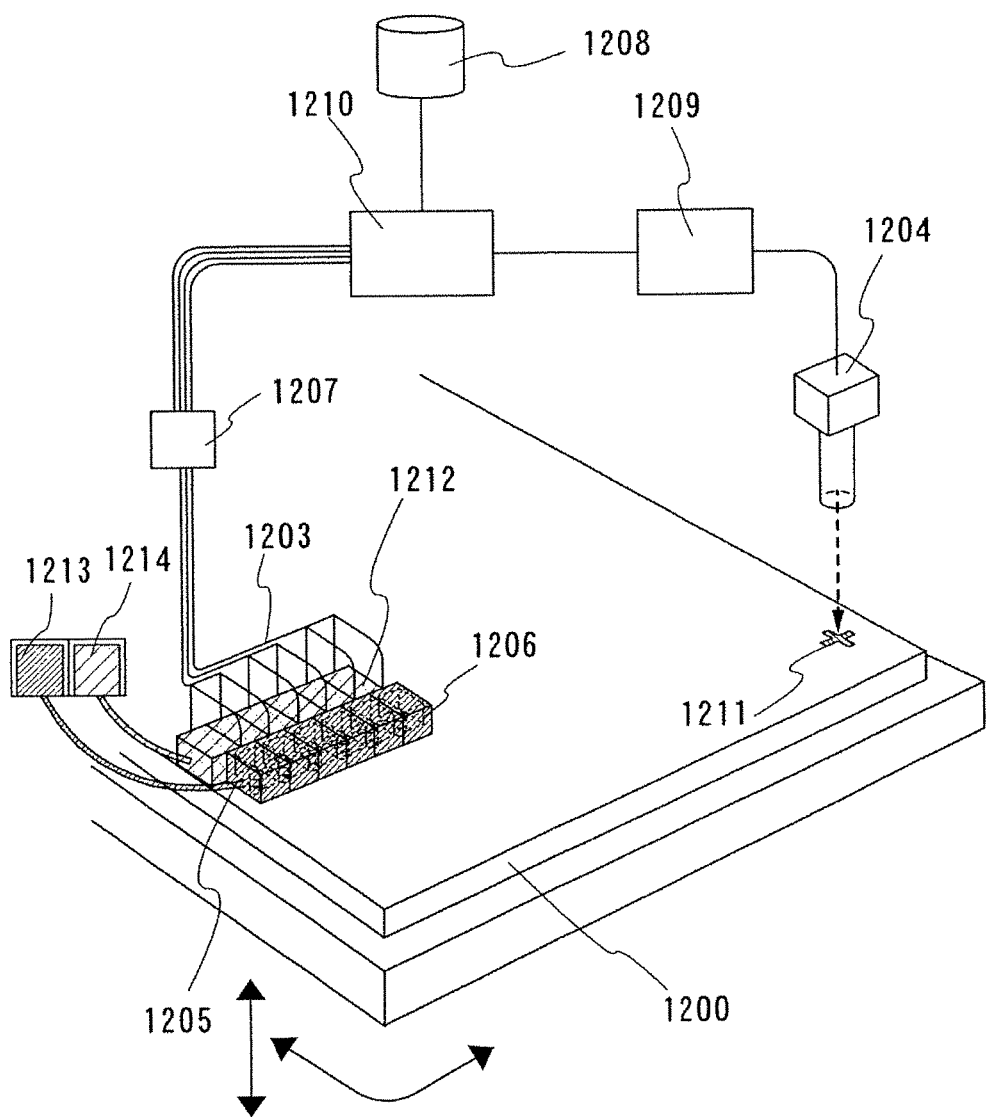
FIG. 12 is an explanatory view of a droplet-discharging apparatus.

FIG. 12 shows one mode of the droplet-discharging apparatus 108 that is used in Embodiment Mode 1. Each of heads 1205 and 1212 of the droplet-discharging apparatus 108 is connected to a control unit 1207, and this control unit 1207 is controlled by a computer 1210, so that a preprogrammed pattern can be drawn.

The drawing position may be determined based on, for example, a marker 1211 that is formed on a substrate 1200 by use of an imaging unit 1204, an image processing unit 1209, and the computer 1210. Alternatively, a reference point may be determined based on an edge of the substrate 1200.

A charge coupled device (CCD), an image sensor using a complementary metal oxide semiconductor (CMOS), or the like can be used as the imaging unit 1204. Needless to say, information about a pattern to be formed on the substrate 1200 is stored in a storage medium 1208, and a control signal is transmitted to the control unit 1207 based on this information, so that the heads 1205 and 1212 of a droplet-discharging unit 1203 can be controlled individually. Materials to be discharged are supplied to the heads 1205 and 1212 from material supply sources 1213 and 1214 via pipes, respectively.

The head 1205 has a structure which includes a space filled with a liquid material as indicated by a dotted line 1206 and a nozzle that is a discharging outlet. Although not shown in the drawing, the head 1212 also has a structure similar to that of the head 1205. When the nozzle sizes of the heads 1205 and 1212 are different from each other, different materials can be concurrently drawn to have different widths. In the case of drawing over a large area, one material can be concurrently discharged from a plurality of nozzles to perform drawing so that throughput can be improved.

Figure 2C:
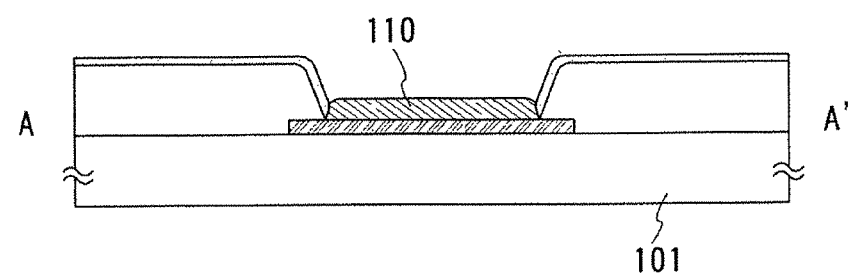

Through the above process, the layer 110 containing an organic compound can be formed only over the photocatalytic conductive film 102 over the substrate 101 (FIG. 2C).

Figure 2D:
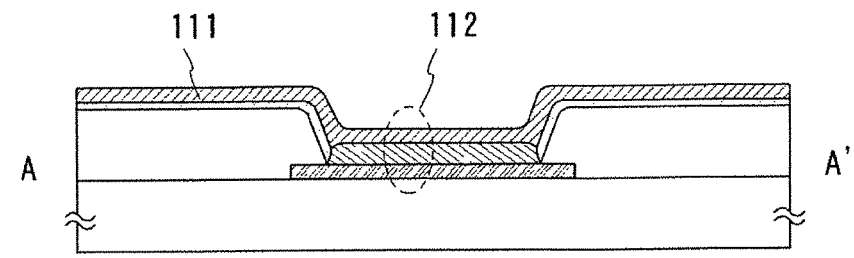

Next, a conductive film 111 is formed over the layer 110 containing an organic compound. Note that the conductive film 111 functions as a second electrode of a light emitting element 112 (FIG. 2D).

It is acceptable as long as a conductive material is used for the conductive film 111. For example, if the photocatalytic conductive film 102 functions as the anode of the light emitting element 112, a metal, an alloy, an electrically conductive compound, or a mixture of them having a low work function (less than or equal to 3.8 eV) is preferably used. As a specific example, an element belonging to Group 1 or 2 in the periodic table, i.e., an alkali metal such as Li or Cs, an alkaline earth metal such as Mg, Ca, or Sr, an alloy containing the above metal (Mg:Ag or Al:Li), a compound containing the above metal (LiF, CsF, or $CaF_2$), or a transition metal containing a rare-earth metal can be used. Further, the above element may be stacked with a metal (including an alloy) such as Al, Ag, or ITO (indium tin oxide).

On the other hand, if the photocatalytic conductive film 102 functions as the cathode of the light emitting element 112, a metal, an alloy, an electrically conductive compound, or a mixture of them having a high work function (greater than or equal to 4.0 eV) is preferably used for the conductive film 111. As a specific example, gold (Au), platinum (Pt), nickel (Ni), tungsten (W), chromium (Cr), molybdenum (Mo), iron (Fe), cobalt (Co), copper (Cu), palladium (Pd), or a nitride of the metal material (titanium nitride) can be given, in addition to indium tin oxide (ITO) or indium zinc oxide (IZO) which is obtained by mixing zinc oxide (ZnO) of 2% to 20% inclusive into indium oxide.

A structure of the light emitting element in Embodiment Mode 1 can be a structure in which the photocatalytic conductive film 102 functioning as a first electrode has a light-transmitting property and the conductive film 111 functioning as the second electrode has a light-blocking property or a reflecting property, or a structure in which the photocatalytic conductive film 102 functioning as the first electrode and the conductive film 111 functioning as the second electrode both have a light-transmitting property. When the first electrode and the second electrode both have a light-transmitting property, a reflective film or a light-blocking film may be provided for the first electrode on the side opposite to the second electrode.

When each electrode is formed of a film having a light-transmitting property or a light-blocking property, a known light-transmitting or light-blocking conductive material may be selected as appropriate, and the film may be thinned. Here, the light-transmitting conductive material means a material having transmittance of visible light of greater than or equal to 40%, the light-blocking conductive material means a material having transmittance of visible light of less than 10%, and the reflective conductive material means a material having reflectivity of visible light of 40% to 100%, inclusive, preferably, 70% to 100%, inclusive.

The conductive film 111 is formed by a sputtering method, a CVD method, an evaporation method, a droplet-discharging method, an ink-jet method, a spin-coating method, or the like, and then patterned into a desired shape by a photolithography method or the like. The thickness of the conductive film 111 is preferably 10 nm to 500 nm, inclusive.

Through the above process, the light emitting element 112 including the layer 110 containing an organic compound which is formed as selected can be formed.

By the method described in Embodiment Mode 1, the layer 110 containing an organic compound can be formed as selected; thus, loss of the material can be reduced. In addition, since a photolithography process for forming a pattern or the like is not necessary, the process can be simplified, and the low cost can be achieved.

(Embodiment Mode 2)

Embodiment Mode 2 will describe a method for manufacturing a light emitting device including a thin film transistor which is electrically connected to the light emitting element manufactured in Embodiment Mode 1, with reference to FIGS. 3A to 3D.

Figure 3A:
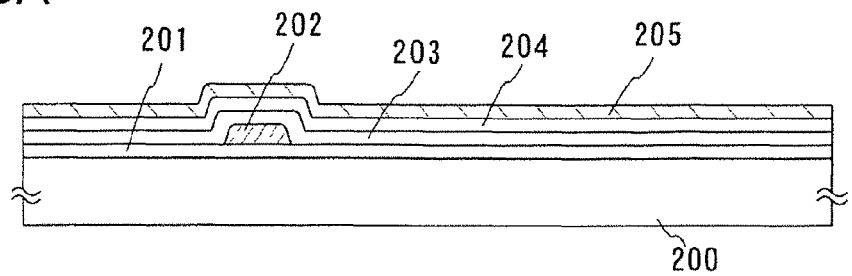
FIGS. 3A to 3D are views showing an example of a light emitting device including an inverted staggered thin film transistor.

As shown in FIG. 3A, an insulating film 201 is formed over a substrate 200. The insulating film 201 functions as a base insulating film and suppresses mixture of impurity elements from a glass substrate into a semiconductor film which is formed later. The insulating film 201 is formed as needed. The insulating film 201 can be formed using an inorganic material such as silicon nitride oxide ($SiN_xO_y$, (X>Y)), aluminum oxide, aluminum nitride, aluminum oxynitride, or aluminum nitride oxide.

As a specific example of the insulating film 201, a single layer structure of a silicon nitride film or a silicon oxynitride film with a thickness of less than or equal to 10 nm, or a two-layer structure in which a silicon nitride oxide film is formed to have a thickness of 50 nm to 100 nm, inclusive, and then a silicon oxynitride film is formed to have a thickness of 100 nm to 150 nm, inclusive, can be given. Further, a three-layer structure in which a silicon nitride oxide film, a silicon oxynitride film, and a silicon nitride film are stacked in sequence may also be used.

Next, a first conductive film is formed over the insulating film 201, and a mask is formed over the first conductive film. The first conductive film is formed of a single layer of an element selected from tantalum (Ta), tungsten (W), titanium (Ti), aluminum (Al), copper (Cu), chromium (Cr), neodymium (Nd), and the like, or an alloy material or a compound material containing the above element as its main component, or formed of stacked layers of any of these. In addition, for a formation method of the first conductive film, a sputtering method, an evaporation method, a CVD method, a coating method, or the like is used as appropriate. Next, the first conductive film is etched using the mask, and a gate electrode 202 is formed.

Next, a gate insulating film 203 is formed over the gate electrode 202. For the gate insulating film 203, an insulating film such as a silicon oxide film, a silicon nitride film, or a silicon oxynitride film is used. Alternatively, a film obtained by application and baking of a composition that contains a siloxane polymer, a light-curable organic resin film, a heat-curable organic resin film, or the like may also be used as the gate insulating film 203.

Next, a first semiconductor film 204 is formed over the gate insulating film 203. This embodiment mode shows an example in which the first semiconductor film 204 is formed of an amorphous semiconductor film. As the amorphous semiconductor film, a microcrystalline semiconductor film or an amorphous semiconductor film which is formed using a semiconductor material gas typified by silane or germanium by a vapor deposition method, a sputtering method, or a thermal CVD method can be used. The thickness of the first semiconductor film 204 is preferably 10 nm to 300 nm, inclusive, more preferably, 30 nm to 200 nm, inclusive.

Furthermore, for the first semiconductor film 204, zinc oxide (ZnO) or an oxide of zinc-gallium-indium formed by a sputtering method or a pulsed laser deposition (PLD) method may also be used; in this case, it is preferable that the gate insulating film be formed of an oxide that contains aluminum or titanium.

Next, a second semiconductor film 205 is formed over the first semiconductor film 204. The second semiconductor film 205 is a semiconductor film that contains an impurity element imparting one conductivity type. Here, a semiconductor film that contains an impurity element imparting n-type conductivity is formed to have a thickness of 20 nm to 80 nm, inclusive. The second semiconductor film 205 can be formed by a known method such as a plasma CVD method or a sputtering method.

Figure 3B:
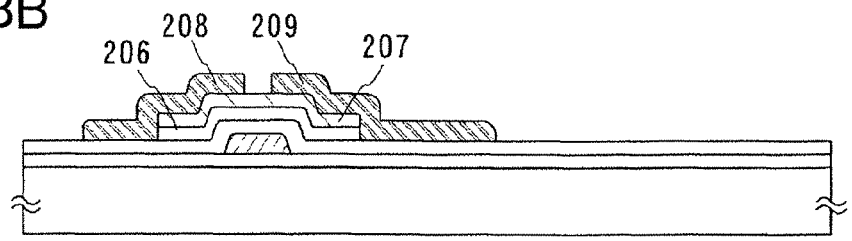

Next, the first semiconductor film 204 and the second semiconductor film 205 are etched using a mask that is formed using a known photolithography technique, and a first semiconductor layer 206 and a second semiconductor layer 207 are obtained (FIG. 3B). Note that the first semiconductor film 204 and the second semiconductor film 205 may be etched as selected using a mask formed by a droplet-discharging method or a printing method (a relief printing method, a planographic printing method, an intaglio printing method, a screen printing method, or the like) instead of a known photolithography technique.

Next, a composition that contains a conductive material (silver (Ag), gold (Au), copper (Cu), tungsten (W), aluminum (Al), or the like) is discharged as selected by a droplet-discharging method, and source or drain electrodes 208 and 209 are formed. Instead of being formed by a droplet-discharging method, the source or drain electrodes 208 and 209 may also be formed by formation of a metal (Ta, W, Ti, Al, Cu, Cr, Nd, or the like) film by a sputtering method and then etching of the metal film using a mask that is formed by a known photolithography technique.

Next, a third semiconductor layer 210 and a fourth semiconductor layer 211 are formed by etching part of the second semiconductor layer 207 using the source or drain electrodes 208 and 209 as masks. In addition, an upper part of the first semiconductor layer 206 is etched using the source or drain electrodes 208 and 209 as masks, so that part of the first semiconductor layer 206 is exposed. Part of the upper portion of the first semiconductor layer 206 is further removed, and a fifth semiconductor layer 212 is formed. An exposed portion of the fifth semiconductor layer 212 is a place that functions as a channel formation region of a thin film transistor.

Next, a protective film 213 is formed in order to prevent contamination of the channel formation region of the fifth semiconductor layer 212 due to impurity elements. For the protective film 213, an insulating film containing silicon nitride or silicon nitride oxide as its main component can be formed by a sputtering method or a PCVD method. Hydrogenation treatment may be performed after formation of the protective film 213. In this way, a thin film transistor 214 is formed.

Next, an interlayer insulating film 215 is formed over the protective film 213. The interlayer insulating film 215 can be formed using an insulating film formed of an organic material such as an acrylic resin, a polyimide resin, a polyamide resin, a siloxane (including a skeleton structure formed by the bond of silicon (Si) and oxygen (O)) resin, a phenol resin, a novolac resin, a melamine resin, an epoxy resin, an urethane resin, or the like. Furthermore, for the interlayer insulating film 215, an insulating film formed of an inorganic material such as silicon oxide, silicon nitride, or silicon oxynitride can be used, or stacked layers of any of these insulating films formed of the organic material and any of these insulating films formed of the inorganic material may be used as well.

Next, the protective film 213 and the interlayer insulating film 215 are removed as selected using a mask formed using a known photolithography technique, and contact holes that reach the source or drain electrodes 208 and 209 are formed.

Figure 3C:
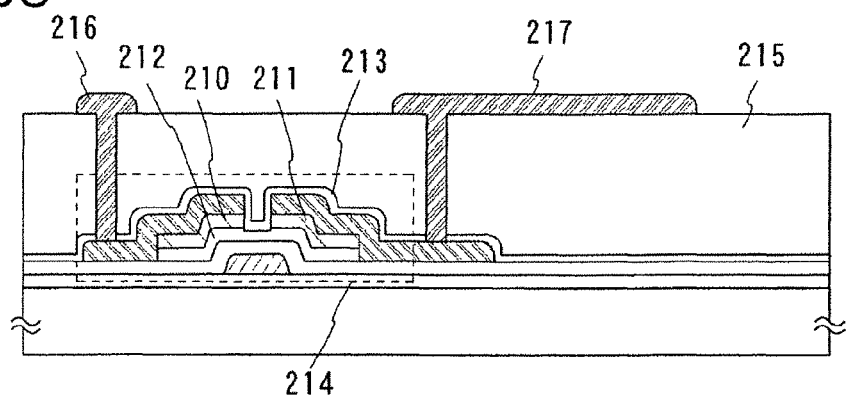
Figure 3D:
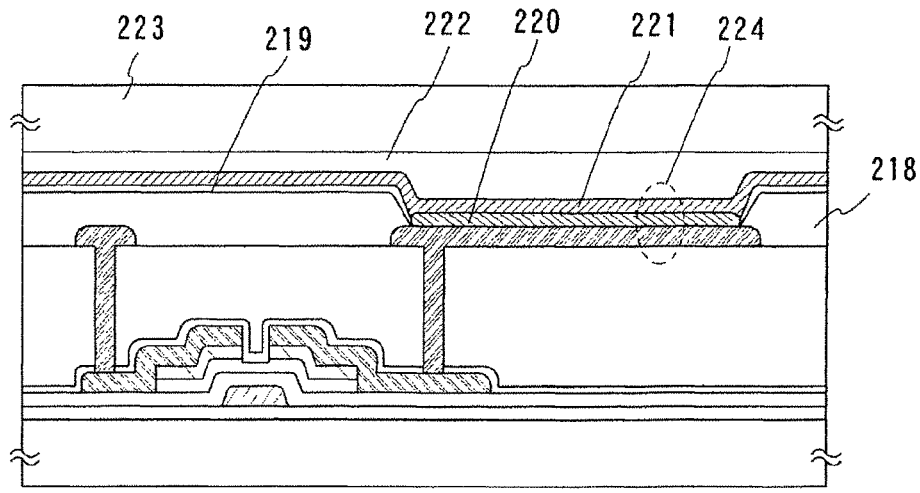

Next, a photocatalytic conductive film is formed by a sputtering method and patterned by a photolithography method, so that a wiring 216 and a first electrode 217 which are electrically connected to the source or drain electrodes 208 and 209, respectively, are formed. The photocatalytic conductive film can be formed using a similar material to that of the photocatalytic conductive film 102 described in Embodiment Mode 1 (FIG. 3C)

Note that the wiring 216 may also be formed in a step which is different from that for forming the first electrode 217, using a conductive material that can be used for the source or drain electrodes 208 and 209.

An insulating film 218 is formed so as to cover the wiring 216 and an end portion of the first electrode 217. The insulating film 218 can be formed using a similar material to that of the insulating film 103 described in Embodiment Mode L Next, the first electrode 217 and the insulating film 218 are irradiated with ultraviolet rays in an oxygen atmosphere so that oxidation treatment is performed to the first electrode 217 and the insulating film 218.

Next, treatment with a silane coupling agent is performed to the first electrode 217 and the insulating film 218. The treatment with a silane coupling agent is the same as in Embodiment Mode 1, and thus its explanation is omitted.

A silane coupling agent film 219 is formed by the treatment with a silane coupling agent, and the surface of the silane coupling agent film 219 is irradiated with light, so that only the silane coupling agent film 219 formed over the first electrode 217 is decomposed and only the surface of the first electrode 217 is modified to be lyophilic.

Next, an organic compound material is applied to the first electrode 217, and a layer 220 containing an organic compound is formed. The layer 220 containing an organic compound in Embodiment Mode 2 can be formed using a similar material and a similar method to those of the layer 110 containing an organic compound described in Embodiment Mode 1. Through the above process, the layer 220 containing an organic compound is formed only over the first electrode 217 as selected.

Then, a second electrode 221 is formed of a conductive film over the layer 220 containing an organic compound. The second electrode 221 functions as one of electrodes of a light emitting element 224. The light emitting element 224 is formed in a region where the first electrode 217, the layer 220 containing an organic compound, and the second electrode 221 overlap with one another.

A conductive film for forming the second electrode 221 in Embodiment Mode 2 can be formed using a similar material and a similar method to those of the conductive film 111 described in Embodiment Mode 1.

A structure of the light emitting element in Embodiment Mode 2 is also similar to that in Embodiment Mode 1 and can be a structure in which the first electrode 217 has a light-transmitting property and the second electrode 221 has a light-blocking property or a reflecting property, a structure in which the first electrode 217 has a light-blocking property or a reflecting property and the second electrode 221 has a light-transmitting property, or a structure in which the first electrode 217 and the second electrode 221 both have a light-transmitting property.

When each electrode is formed of a film having a light-transmitting property or a light-blocking property, a known light-transmitting or light-blocking conductive material may be selected as appropriate, and the film may be thinned. Here, the light-transmitting conductive material means a material having transmittance of visible light of greater than or equal to 40%, the light-blocking conductive material means a material having transmittance of visible light of less than 10%, and the reflective conductive material means a material having reflectivity of visible light of 40% to 100%, inclusive, preferably, 70% to 100%, inclusive.

Further, a substrate 223 is attached to the substrate 200 to seal the light emitting element 224. Note that a space 222 between the substrate 223 and the light emitting element 224 may be filled with an inert gas such as nitrogen.

Through the above process, an active matrix light emitting device including a light emitting element electrically connected to a thin film transistor can be manufactured.

As for the active matrix light emitting device which is manufactured by the method described in Embodiment Mode 2, a photolithography process or the like for patterning the layer containing an organic compound of the light emitting element is not necessary, so that the manufacturing process can be simplified. In addition, the layer containing an organic compound can be formed as selected more accurately than in a conventional case; thus, loss of the material can be reduced and the low cost can be achieved.

The structure shown in Embodiment Mode 2 can be used by being freely combined with the structure shown in Embodiment Mode 1.

(Embodiment Mode 3)

Embodiment Mode 3 will describe a method for manufacturing a light emitting device including a light emitting element electrically connected to an organic thin film transistor with reference to FIGS. 4A to 4D.

As in Embodiment Mode 2, an insulating film 301 is formed over a substrate 300. Then, a first conductive film 302 which functions as a gate electrode is formed over the insulating film 301. It is acceptable as long as the first conductive film 302 is formed of a metal which has an insulating property by nitridation or oxidation, preferably, tantalum (Ta), niobium (Nb), aluminum (Al), copper (Cu), titanium (Ti), or the like. Besides, tungsten (W), chromium (Cr), nickel (Ni), cobalt (Co), magnesium (Mg), or the like can also be used.

A manufacturing method of the first conductive film 302 is not limited to a particular method, and the first conductive film 302 may be formed by a sputtering method, an evaporation method, or the like and patterned into a desired shape by etching or the like. Further, the first conductive film 302 may also be formed by applying droplets of a material for forming the first conductive film 302 by an ink-jet method or the like.

Next, the first conductive film 302 is nitrided or oxidized, so that a gate insulating film 303 formed of a nitride, an oxide, or an oxynitride of the metal is formed. Note that the first conductive film 302 other than part which has an insulating property by nitridation or oxidation to be the gate insulating film 303 functions as a gate electrode.

Next, a semiconductor layer 304 is formed to cover the gate insulating film 303. For an organic semiconductor material used to form the semiconductor layer 304, either a low-molecular weight material or a high-molecular weight material can be used as long as it is an organic material that has carrier transportability and one in which changes in the carrier density due to electric field effects are possible, and the following types can be used: polycyclic aromatic compounds, conjugated double bond compounds, metal phthalocyanine complexes, charge-transfer complexes, condensed ring tetracarboxylic acid diimides, oligothiophenes, fullerenes, carbon nanotubes, and the like. For example, polypyrrole, polythiophene, poly(3-alkylthiophene), polyphenylenevinylene, polyp-phenylenevinylene), polyaniline, polydiacetylene, polyazulene, polypyrene, polycarbazole, polyselenophene, polyfuran, polyp-phenylene), polyindole, polypyridazine, naphthacene, hexacene, heptacene, pyrene, chrysene, perylene, coronene, terrylene, ovalene, quaterrylene, circumanthracene, triphenodioxazine, triphenodithiazine, hexacene-6,15-quinone, polyvinyl carbazole, polyphenylene sulfide, polyvinylene sulfide, polyvinylpyridine, naphthalene tetracarboxylic acid diimide, anthracene tetracarboxylic acid diimide, C60, C70, C76, C78, and C84, and derivatives of any of these can be used.

Furthermore, for specific examples of these materials, tetracene, pentacene, sexithiophene (6T), copper phthalocyanine, his(1,2,5-thiadiazolo)-p-quinobis(1,3-dithiole), rubrene, poly(2,5-thienylene vinylene) (PTV), poly(3-hexylthiophene-2,5-diyl) (P3HT), and poly(9,9'-dioctyl-fluorene-co-bithiophene) (F8T2), which are generally considered to be p-type semiconductors; and 7,7,8,8-tetracyanoquinodimethane (TCNQ), 3,4,9,10-perylenetetracarboxylic dianhydride (PTCDA), 1,4,5,8-naphthalenetetracarboxylic dianhydride (NTCDA), N,N'-dioctyl-3,4,9,10-perylenetetracarboxylic diimide (PTCDI-C8H), copper hexadecafluorophthalocyanine ($F_{16}$CuPc); N,N'-bis(2,2,3,3,4,4,5,5,6,6,7,7,8,8,8-pentadecafluorooctyl)-1,4,5,8-naphthalenetetracarboxylic diimide (NTCDI-C8F), 3',4'-dibutyl-5,5"-bis(dicyanomethylene)-5,5"-dihydro-2,2': 5',2"-terthiophene) (DCMT), and methanofullerene[6,6]-phenyl-$C_{61}$ butyric acid methyl ester (PCBM), which are generally considered to be n-type semiconductors; and the like can be given.

Note that the attributes of p-type and n-type of organic semiconductors are not inherent characteristics of the substances themselves but depend on the relationship between the substance and an electrode from which carriers are injected or the strength of the electric field when carriers are injected, and semiconductor materials tend toward one of p-type and n-type but can be used as either one. In this embodiment mode, using p-type semiconductors is more preferable than using n-type semiconductors.

These organic semiconductor materials can be used to form films by an evaporation method, a spin-coating method, a droplet-discharging method, or the like.

Next, buffer layers 305 are formed over the semiconductor layer 304 in order to improve adhesiveness and the chemical stability at an interface. For the buffer layer 305, an organic material that has conductivity (an organic compound that exhibits electron-acceptability, for example, 7,7,8,8-tetracyanoquinodimethane (TCNQ); 2,3,5,6-tetrafluoro-7,7, 8,8-tetracyanoquinodimethane ($F_4$-TCNQ); or the like) or a composite material of an organic compound and a metal oxide may be used. The buffer layers 305 are not formed if they are not needed.

Next, source or drain electrodes 306 and 307 are formed over the buffer layers 305. There are no particular limitations on the materials used for the source or drain electrodes 306 and 307, and a metal such as gold (Au), platinum (Pt), aluminum (Al), tungsten (W), titanium (Ti), copper (Cu), tantalum (Ta), niobium (Nb), chromium (Cr), nickel (Ni), cobalt (Co), magnesium (Mg), or the like, or an alloy that contains any of these metals can be used. In addition, for other materials that can be used for the source or drain electrodes 306 and 307, a conductive high-molecular weight compound such as polyaniline, polypyrrole, polythiophene, polyacetylene, or polydiacetylene can be given.

There are no particular limitations on the formation method of the source or drain electrodes 306 and 307 as long as it is a method in which the semiconductor layer 304 is not decomposed, and the source or drain electrodes 306 and 307 may be formed by a sputtering method, an evaporation method, or the like and patterned into a desired shape by an etching method or the like. Alternatively, the source or drain electrodes 306 and 307 may be formed by an ink-jet method or the like. By the above process, an organic thin film transistor 308 is formed.

In addition, an organic insulating material such as polyimide, polyamic acid, or polyvinyl phenyl may be formed in contact with the lower surface of the semiconductor layer 304. By this kind of structure, orientation of the organic semiconductor material can be improved even more, and adhesiveness between the gate insulating film 303 and the semiconductor layer 304 can be further improved.

Next, an interlayer insulating film 309 is formed to cover the organic thin film transistor 308. Then, the interlayer insulating film 309 is etched as selected, and contact holes that reach the source or drain electrodes 306 and 307 are formed. Next, a wiring 310 and a first electrode 311 electrically connected to the source or drain electrodes 306 and 307 are formed.

A photocatalytic conductive film is formed by a sputtering method and patterned by a photolithography method, so that the wiring 310 and the first electrode 311 which are electrically connected to the source or drain electrodes 306 and 307 are formed. The photocatalytic conductive film can be formed using a similar material to that of the photocatalytic conductive film 102 shown in Embodiment Mode 1 (FIG. 4C).

Note that the wiring 310 can also be formed in a step which is different from that for forming the first electrode 311, using a conductive material that can be used for the source or drain electrodes 306 and 307.

In addition, an insulating film 312 is formed so as to cover the wiring 310 and an end portion of the first electrode 311. The insulating film 312 can be formed using a similar material to that of the insulating film 103 shown in Embodiment Mode 1.

Next, the first electrode 311 and the insulating film 312 are irradiated with ultraviolet rays in an oxygen atmosphere so that oxidation treatment is performed to the first electrode 311 and the insulating film 312.

Next, treatment with a silane coupling agent is performed to the first electrode 311 and the insulating film 312. The treatment with a silane coupling agent is the same as in Embodiment Mode 1, and thus its explanation is omitted.

A silane coupling agent film 313 is formed by the treatment with a silane coupling agent, and the surface of the silane coupling agent film 313 is irradiated with light, so that only the silane coupling agent film 313 formed over the first electrode 311 is decomposed and only the surface of the first electrode 311 is modified to be lyophilic.

Next, an organic compound material is applied to the first electrode 311, and a layer 314 containing an organic compound is formed. The layer 314 containing an organic compound in Embodiment Mode 3 can be formed using a similar material and a similar method to those of the layer 110 containing an organic compound described in Embodiment Mode 1. In this manner, the layer 314 containing an organic compound is formed only over the first electrode 311 as selected.

Then, a second electrode 315 formed of a conductive film is formed over the layer 314 containing an organic compound. The second electrode 315 functions as one of electrodes of a light emitting element 316. The light emitting element 316 is formed in a region where the first electrode 311, the layer 314 containing an organic compound, and the second electrode 315 overlap with one another.

A conductive film for forming the second electrode 315 in Embodiment Mode 3 can be formed using a similar material and a similar method to those of the conductive film 111 described in Embodiment Mode 1.

A structure of the light emitting element in Embodiment Mode 3 is also similar to that in Embodiment Mode 1 and can be a structure in which the first electrode 311 has a light-transmitting property and the second electrode 315 has a light-blocking property or a reflecting property, a structure in which the first electrode 311 has a light-blocking property or a reflecting property and the second electrode 315 has a light-transmitting property, or a structure in which the first electrode 311 and the second electrode 315 both have a light-transmitting property.

When each electrode is formed of a film having a light-transmitting property or a light-blocking property, a known light-transmitting or light-blocking conductive material may be selected as appropriate, and the film may be thinned. Here, the light-transmitting conductive material means a material having transmittance of visible light of greater than or equal to 40%, the light-blocking conductive material means a material having transmittance of visible light of less than 10%, and the reflective conductive material means a material having reflectivity of visible light of 40% to 100%, inclusive, preferably, 70% to 100%, inclusive.

Further, a substrate 323 is attached to the substrate 300 to seal the light emitting element 316. Note that a space 321 between the substrate 323 and the light emitting element 316 may be filled with an inert gas such as nitrogen.

Through the above process, an active matrix light emitting device including a light emitting element electrically connected to an organic thin film transistor can be manufactured.

As for the active matrix light emitting device which is manufactured by the method described in Embodiment Mode 3, a photolithography process or the like for patterning the layer containing an organic compound of the light emitting element is not necessary, so that the manufacturing process can be simplified. In addition, the layer containing an organic compound can be formed as selected more accurately than in a conventional case; thus, loss of the material can be reduced and the low cost can be achieved.

The structure shown in Embodiment Mode 3 can be used by being freely combined with the structure shown in Embodiment Mode 1.

Figure 4A:
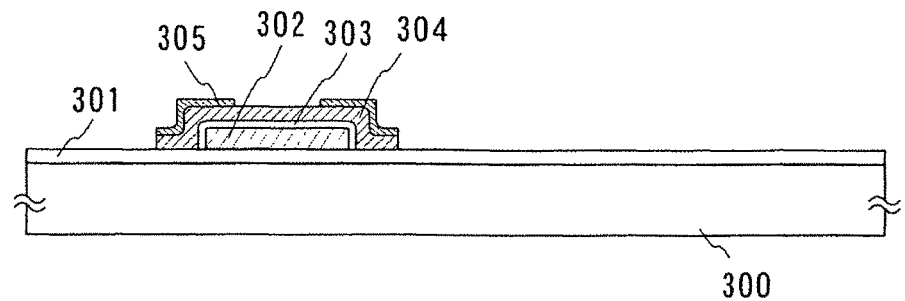
FIGS. 4A to 4D are views showing an example of a light emitting device including an organic thin film transistor.
Figure 4B:
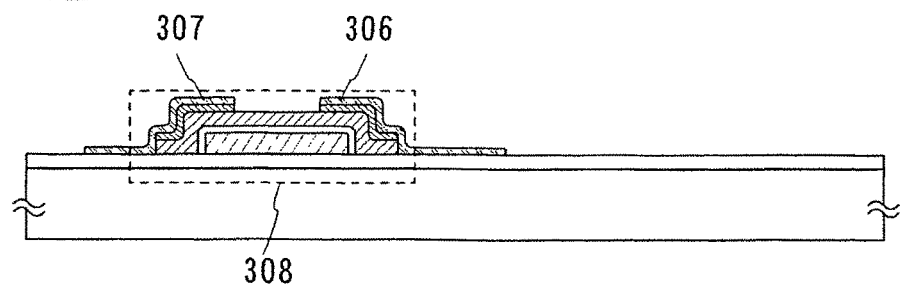
Figure 4C:
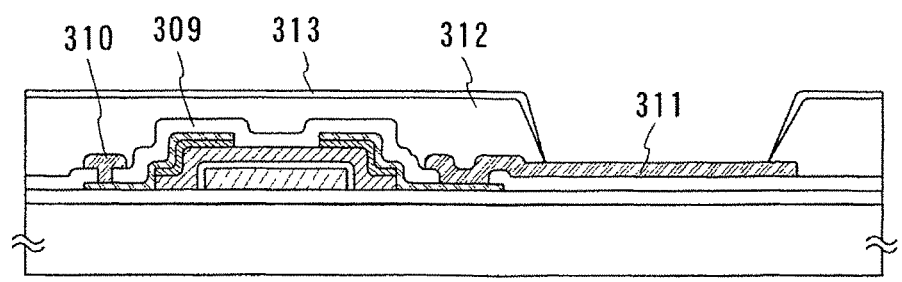
Figure 4D:
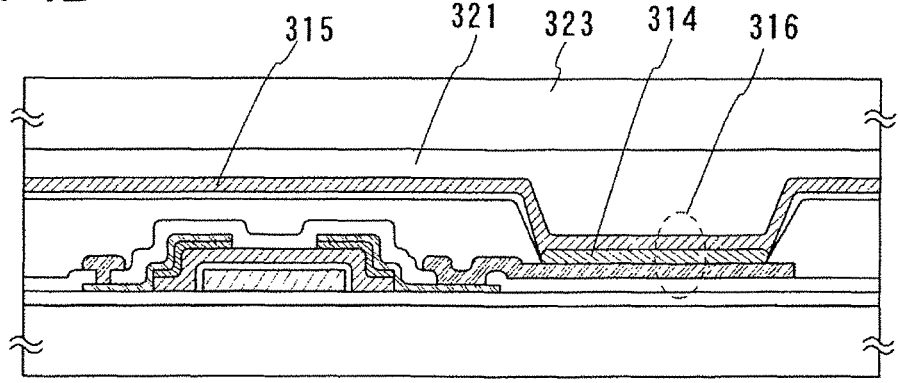
Figure 5A:
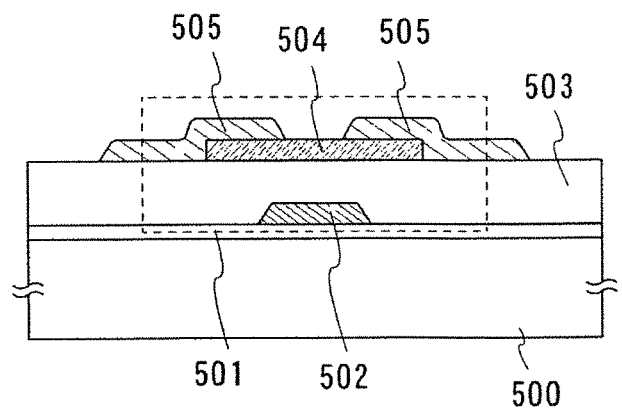
FIGS. 5A and 5B are explanatory views each showing a structure of an organic thin film transistor.
Figure 5B:
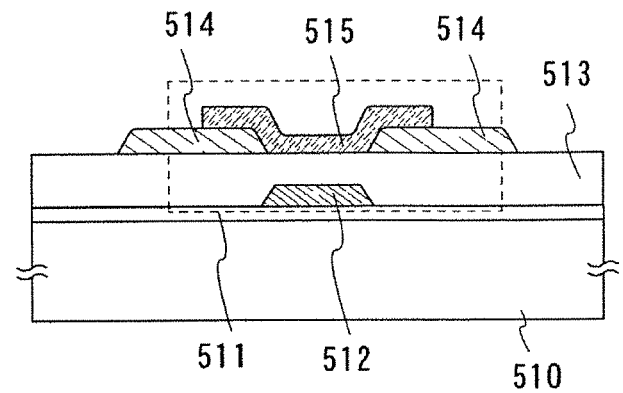

In addition, the organic thin film transistor used in Embodiment Mode 3 is not limited to the structure of the organic thin film transistor 308 shown in FIG. 4B and may have a structure shown in FIG. 5A or 5B.

FIG. 5A shows one example of organic thin film transistors having a structure called an inverted staggered top contact structure. An organic thin film transistor 501 formed over a substrate 500 includes a gate electrode 502, a gate insulating film 503 which is formed over the gate electrode 502, a semiconductor layer 504 which is formed over the gate insulating film 503 in a position overlapping with the gate electrode 502, and source or drain electrodes 505 which are electrically connected to the semiconductor layer 504. Note that parts of the semiconductor layer 504 are sandwiched between the gate insulating film 503 and the source or drain electrodes 505.

The gate electrode 502 can be formed using a similar material and a similar method to those of the first conductive film 302. Besides, the gate electrode 502 can also be formed by a droplet-discharging method, a printing method, or the like. For typical examples of fine particles used in a droplet-discharging method, a printing method, or the like, fine particles whose main component is any of gold, copper, an alloy of gold and silver, an alloy of gold and copper, an alloy of silver and copper, and an alloy of gold, silver, and copper; fine particles whose main component is a conductive oxide such as ITO; and the like can be given.

The gate insulating film 503 can be formed by an evaporation method, a spin-coating method, a droplet-discharging method, or the like using an organic material such as an acrylic resin, a polyimide resin, a polyamide resin, a siloxane (including a skeleton structure formed by the bond of silicon (Si) and oxygen (O)) resin, a phenol resin, a novolac resin, a melamine resin, an epoxy resin, or an urethane resin as well as an inorganic material such as silicon nitride, silicon oxide, or aluminum nitride.

The semiconductor layer 504 can be formed using a similar material and a similar method to those of the semiconductor layer 304.

Further, the source or drain electrodes 505 can be formed using a similar material and a similar method to those of the source or drain electrodes 306 and 307.

FIG. 5B shows one example of organic thin film transistors having a structure called an inverted staggered bottom contact structure. An organic thin film transistor 511 formed over a substrate 510 includes a gate electrode 512, a gate insulating film 513 which is formed over the gate electrode 512, source or drain electrodes 514 which are formed over the gate insulating film 513, and a semiconductor layer 515 which is formed over the source or drain electrodes 514. Note that parts of the source or drain electrodes 514 are sandwiched between the gate insulating film 513 and the semiconductor layer 515

The gate electrode 512 can be formed using a similar material and a similar method to those of the first conductive film 302. Besides, the gate electrode 512 can also be formed by a droplet-discharging method, a printing method, or the like. For typical examples for fine particles used in a droplet-discharging method, a printing method, or the like, fine particles whose main component is any of gold, copper, an alloy of gold and silver, an alloy of gold and copper, an alloy of silver and copper, and an alloy of gold, silver, and copper; fine particles whose main component is a conductive oxide such as ITO; and the like can be given.

The gate insulating film 513 can be formed by an evaporation method, a spin-coating method, a droplet-discharging method, or the like using an organic material such as an acrylic resin, a polyimide resin, a polyamide resin, a siloxane (including a skeleton structure formed by the bond of silicon (Si) and oxygen (O)) resin, a phenol resin, a novolac resin, a melamine resin, an epoxy resin, or an urethane resin as well as an inorganic material such as silicon nitride, silicon oxide, or aluminum nitride.

The source or drain electrodes 514 can be formed using a similar material and a similar method to those of the source or drain electrodes 306 and 307.

Further, the semiconductor layer 515 can be formed using a similar material and a similar method to those of the semiconductor layer 304.

(Embodiment Mode 4)

Embodiment Mode 4 will describe an example in which a passive matrix light emitting device is manufactured over a glass substrate with reference to FIGS. 6A to 6C, 7, and 8.

A passive matrix (simple matrix) light emitting device has a structure in which a plurality of anodes arranged in parallel stripe form (band form) and a plurality of cathodes arranged in parallel stripe form are orthogonal to each other and a layer containing an organic compound having a light emitting property or a fluorescent property is inserted at an intersection of each of the plurality of anodes and each of the plurality of cathodes. Consequently, a pixel located at an intersection of a selected anode (an anode to which a voltage is applied) and a selected cathode comes to be lit up.

Figure 6A:
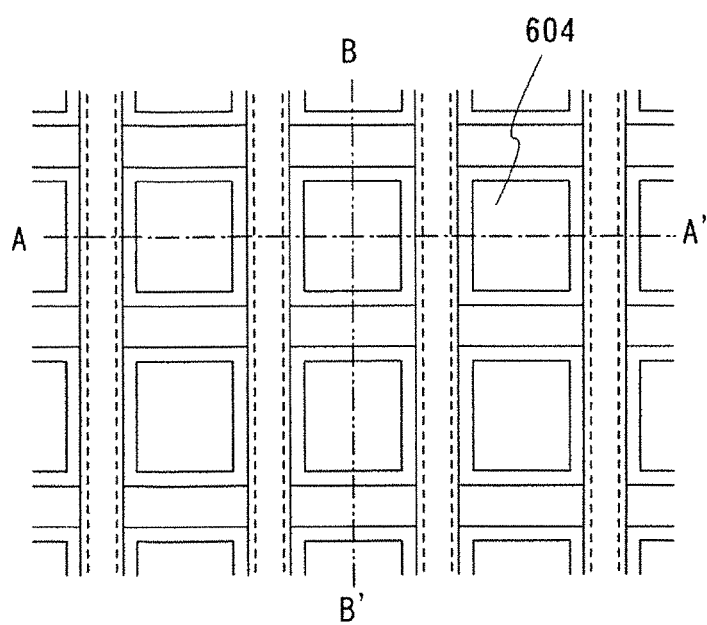
FIG. 6A is a top view and FIGS. 6B and 6C are cross-sectional views showing a passive matrix light emitting device.
Figure 6C:
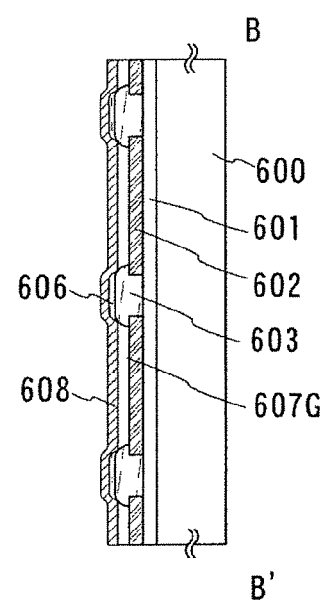
Figure 6B:
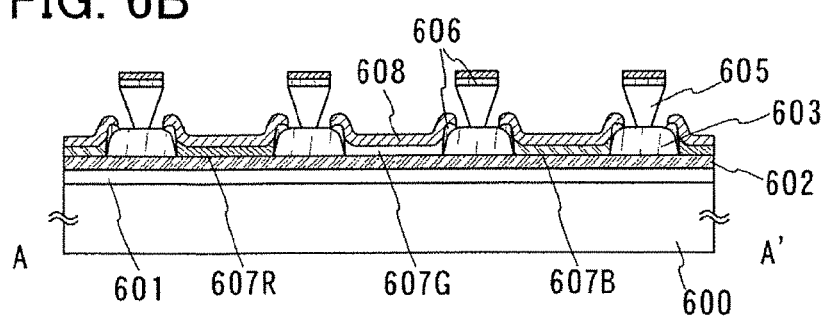

FIG. 6A is a top view of a pixel portion before sealing. FIG. 6B is a cross-sectional view of a cross section taken along a dotted line A-A' in FIG. 6A, and FIG. 6C is a cross-sectional view of a cross section taken along a dotted line B-B' in FIG. 6A.

Over a first substrate 600, an insulating film 601 is formed as a base film. Note that the base film is not formed, if it is not needed. Over the insulating film 601, a plurality of first electrodes 602 is arranged in stripe form with equal spacing therebetween. Furthermore, over the first electrodes 602, a partition wall 603 that has openings each corresponding to a pixel is provided, and the partition wall 603 that has openings is formed of an insulating material (a photosensitive or nonphotosensitive organic material (an acrylic resin, a polyimide resin, a polyamide resin, a siloxane (including a skeleton structure formed by the bond of silicon (Si) and oxygen (O)) resin, a phenol resin, a novolac resin, a melamine resin, an epoxy resin, an urethane resin, a resist, benzocyclobutane, or an SOG film (for example, an $SiO_x$ film that has an alkyl group)). Note that the opening corresponding to each pixel acts as a light emitting region 604.

Over the partition wall 603 that has openings, a plurality of mutually parallel reverse taper partition walls 605 is provided to intersect with the first electrodes 602. The reverse taper partition walls 605 are formed by a photolithography method using a positive type photosensitive resin whose part which is not exposed to light is used as a pattern, along with adjustment of the amount of exposure to light and length of time for image development, so that the lower part of a pattern is etched more than other parts.

Next, the first electrodes 602, the partition wall 603, and the partition walls 605 are irradiated with ultraviolet rays in an oxygen atmosphere by a similar method to that in Embodiment Mode 1 so that oxidation treatment is performed to the first electrodes 602, the partition wall 603, and the partition walls 605. Then, treatment with a silane coupling agent is performed to the first electrodes 602 and the partition walls 605.

A silane coupling agent film 606 is formed by the treatment with a silane coupling agent, and the surface of the silane coupling agent film 606 is irradiated with light, so that only parts of the silane coupling agent film 606 formed over the first electrodes 602 are decomposed and only the surfaces of the first electrodes 602 are modified to be lyophilic.

Figure 7:
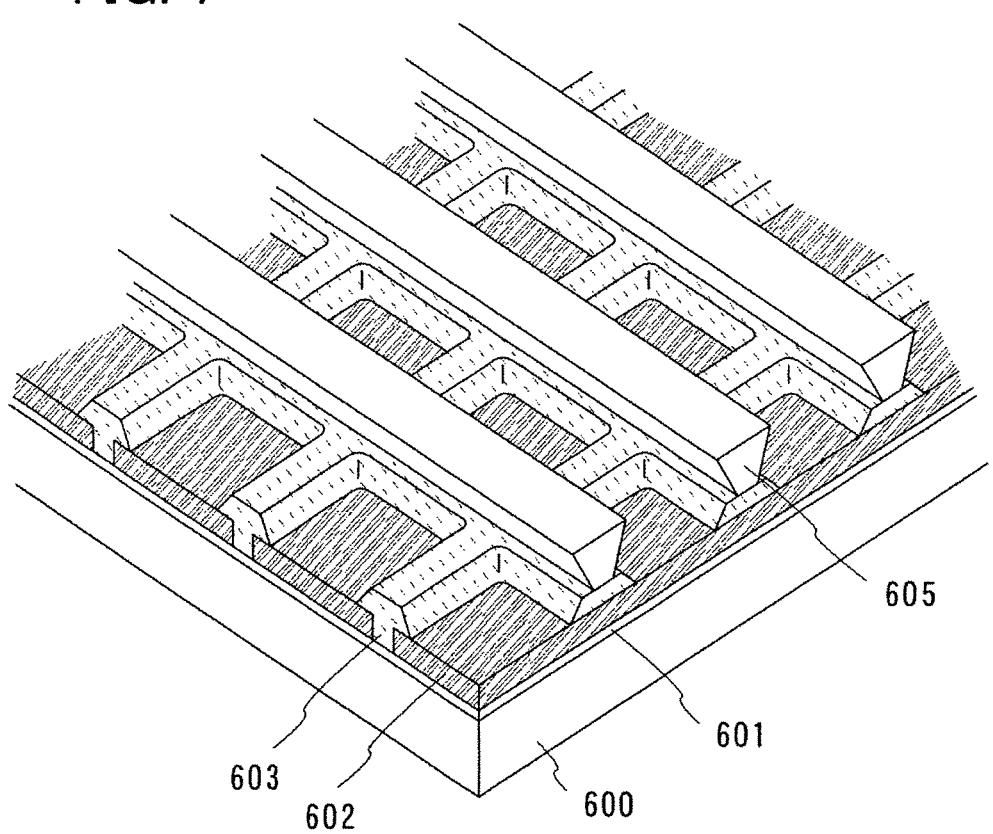
FIG. 7 is a perspective view of a passive matrix light emitting device.

Furthermore, FIG. 7 is a perspective view showing the device right after the plurality of parallel reverse taper partition walls 605 has been formed. Note that the same portions as in FIGS. 6A to 6C are denoted by the same reference numerals.

The height of the reverse taper partition walls 605 is set to be larger than the combined film thicknesses of layers containing an organic compound (607R, 607G, and 607B) and second electrodes 608. When the layers containing an organic compound (607R, 607G, and 607B) and conductive films are stacked over a substrate that has the structure shown in FIG. 7, a plurality of electrically independent regions is provided as shown in FIGS. 6A to 6C, and the layers containing an organic compound (607R, 607G, and 607B) and the second electrodes 608 formed of the conductive films are formed in the electrically independent regions.

The second electrodes 608 are mutually parallel striped-form electrodes that extend in a direction intersecting with the first electrodes 602. In the present invention, only the surfaces of the first electrodes 602 are made to be lyophilic, and the surfaces of the reverse taper partition walls 605 are made to be liquid-repellent; therefore, the layers containing an organic compound (607R, 607G, and 607B) can be formed over the first electrodes 602 as selected.

The layers containing an organic compound (607R, 607G, and 607B) in Embodiment Mode 4 can be formed by a droplet-discharging method as in Embodiment Modes 1 to 3. In addition, the second electrodes 608 can be formed by a similar method to those in Embodiment Modes 1 to 3. When the second electrodes 608 are formed, the conductive films are formed also over the reverse taper partition walls 605 but are electrically disconnected from the second electrodes 608.

Here, an example is shown, in which a light emitting device capable of full-color display, where emission of three different colors of light (R, G, and B) is obtained by formation of the layers containing an organic compound (607R, 607G, and 607B) as selected, is formed. The layers containing an organic compound (607R, 607G and 607B) are formed into a mutually parallel stripe pattern.

Furthermore, light emitting elements of a single color may be provided by formation of stacked-layer films that each include a light emitting layer that emits light of the same emission color over the entire surface, and the light emitting device may be set to be one by which monochrome display can be achieved or one by which area color display can be achieved. In addition, the light emitting device may be set to be one by which full-color display can be achieved by combination of a color filter and a light emitting device in which emission of white light is obtained.

Further, the light emitting device is sealed using a sealing material such as a sealing can or a glass substrate for sealing, if necessary. Here, a glass substrate is used as a second substrate, and the first substrate and the second substrate are attached to each other using an adhesive material such as a sealant, so that a space surrounded by the adhesive material such as the sealant is hermetically sealed. The space that is hermetically sealed is filled with a filler or a dried inert gas.

Moreover, a space between the first substrate and the sealant may be filled and sealed with a drying agent in order to improve reliability of the light emitting device. The drying agent removes a minute amount of moisture, so that sufficient drying is performed. For the drying agent, a substance that adsorbs moisture by chemical adsorption such as an oxide of an alkaline earth metal such as calcium oxide or barium oxide can be used. In addition, a substance that adsorbs moisture by physical adsorption such as zeolite or silica gel may also be used for the drying agent.

The drying agent is not necessarily provided if the sealant is provided to cover and be in contact with the light emitting element to sufficiently block the outside air.

Figure 8:
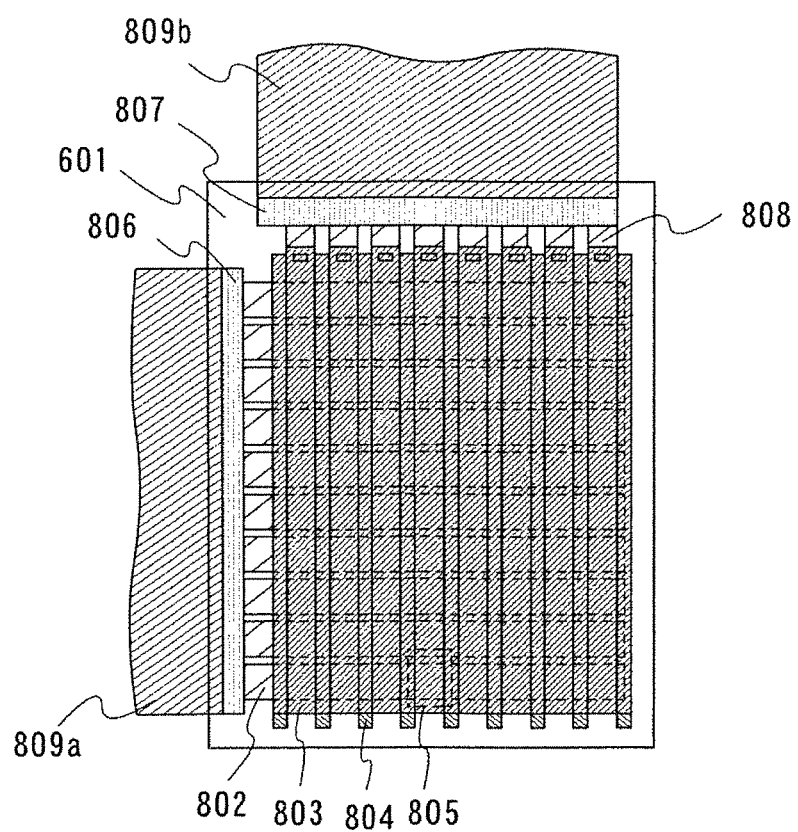
FIG. 8 is a top view of a passive matrix light emitting device.

Next, FIG. 8 is a top view of a light emitting module on which an FPC or the like is mounted. In a pixel portion forming an image display as shown in FIG. 8, scanning lines and data lines are arranged to intersect with each other so that the scanning lines and the data lines are orthogonal to each other.

The first electrode 602, the second electrode 608, and the reverse taper partition wall 605 of FIGS. 6A to 6C correspond to a scanning line 802, a data line 803, and a partition wall 804 of FIG. 8, respectively. A light emitting layer is interposed between the data line 803 and the scanning line 802, and an intersection indicated by a region 805 is defined as a single pixel.

The data line 803 is electrically connected to a connecting wiring 808 at the edge of the wiring, and the connecting wiring 808 is connected to an FPC 809b via an input terminal 807. In addition, the scanning line 802 is connected to an FPC 809a via an input terminal 806.

In addition, if necessary, optical films such as a polarizer or a circular polarizer (including an elliptical polarizer), a retarder plate (a quarter-wave plate, a half-wave plate), and a color filter may be provided on a light emitting surface of the light emitting element as appropriate. Moreover, an antireflective film may be provided over the polarizer or circular polarizer. For example, antiglare treatment can be performed by which reflection of light can be diffused due to unevenness on the surface and glare can be reduced.

In addition, FIG. 8 shows an example in which no driver circuit is provided over the substrate; however, an IC chip that has a driver circuit may be mounted as described below.

When the IC chip is mounted, in a region in the periphery (outer side) of the pixel portion, an IC on the data line side and an IC on the scanning line side each having a driver circuit that is used to transmit a variety of signals to the pixel portion are mounted by a COG method, TCP and wire bonding methods may be used as mounting techniques, in addition to the COG method, to mount the ICs. TCP is obtained by mounting an IC onto TAB tape, and the TAB tape is connected to a wiring over an element formation substrate, so that the IC is mounted.

The IC on the data line side and the IC on the scanning line side may be ICs formed using a silicon substrate, or have driver circuits formed using TFTs over a glass substrate, a quartz substrate, or a plastic substrate. In addition, an example is shown in which one IC is provided on one side; however, the structure may be one in which a plurality of ICs is provided on one side.

Through the above process, a passive matrix light emitting device can be manufactured.

As for the passive matrix light emitting device which is manufactured by the method shown in Embodiment Mode 4, the layer containing an organic compound of the light emitting element can be formed as selected more accurately than in a conventional case; thus, loss of the material can be reduced and the low cost can be achieved.

The structure shown in Embodiment Mode 4 can be freely combined with the structure shown in Embodiment Mode 1.

(Embodiment Mode 5)

Figure 9A:
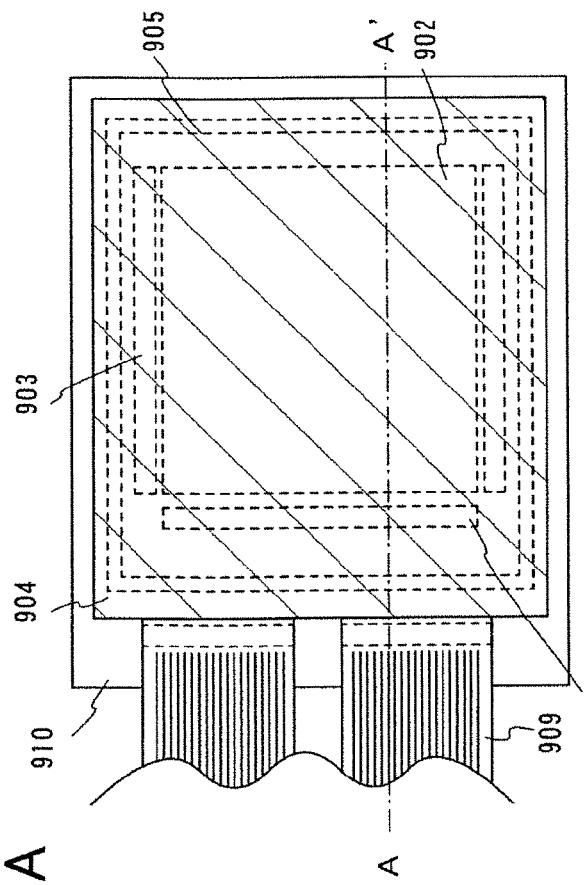
FIGS. 9A and 9B are views showing a sealing structure of a light emitting device.
Figure 9B:
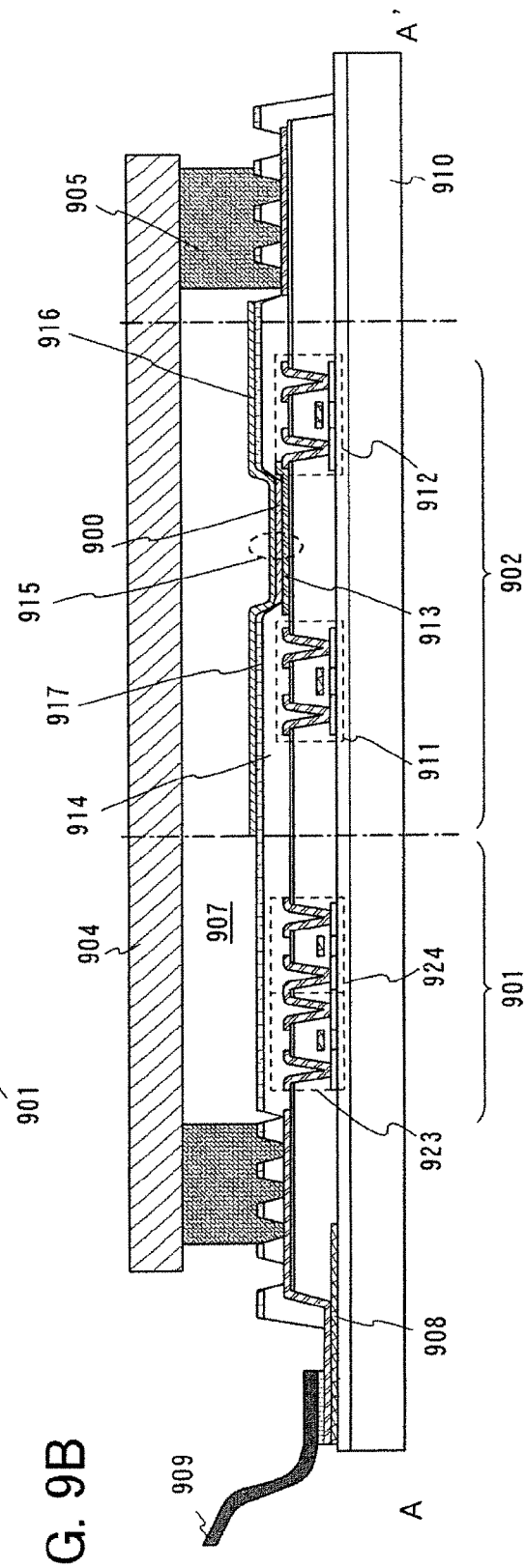

In Embodiment Mode 5, a light emitting device of the present invention in which a tight emitting element formed over a substrate is sealed between substrates will be described with reference to FIGS. 9A and 9B. FIG. 9A is a top view showing a light emitting device and FIG. 9B is a cross-sectional view of a cross section taken along a line A-A' in FIG. 9A. A reference numeral 901 indicated by a dotted line denotes a driver circuit portion (source side driver circuit); 902, a pixel portion; 903, a driver circuit portion (gate side driver circuit); 904, a sealing substrate; 905, a sealant, and 907, a space surrounded by the sealant 905.

A reference numeral 908 denotes a wiring for transmitting a signal inputted to the source side driver circuit 901 and the gate side driver circuit 903, and the wiring 908 receives a video signal, a clock signal, a start signal, a reset signal, and the like from an flexible printed circuit (FPC) 909 that is to be an external input terminal. Although only the FPC is illustrated here, a printed wiring board (PWB) may be attached to the FPC. The light emitting device in this specification includes not only the light emitting device itself but also the light emitting device provided with the FPC or the PWB.

Next, a cross-sectional structure will be described with reference to FIG. 9B. A driver circuit portion and a pixel portion are formed over an element substrate 910, and the pixel portion 902 and the source side driver circuit 901 that is a driver circuit portion are illustrated here.

As the source side driver circuit 901, a CMOS circuit in which an n-channel TFT 923 and a p-channel TFT 924 are combined is formed. A circuit included in the driver circuit may be a known CMOS circuit, PMOS circuit, or NMOS circuit. In this embodiment mode, a driver-integrated type in which a driver circuit is formed over a substrate is described; however, it is not necessary to have such a structure, and the driver circuit can be formed not over the substrate but outside the substrate.

The pixel portion 902 is formed with a plurality of pixels each including a switching TFT 911, a current control TFT 912, and a first electrode 913 that is electrically connected to a drain of the current control TFT 912. An insulator 914 is formed so as to cover an end portion of the first electrode 913. Here, the insulator 914 is formed using a positive type photosensitive acrylic resin film.

For the insulator 914, either a negative type photosensitive insulating material that becomes insoluble in an etchant by light or a positive type photosensitive insulating material that becomes soluble in an etchant by light can be used, and an inorganic compound (such as silicon oxide or silicon oxynitride) as well as an organic compound can be used.

The surfaces of the first electrode 913 and the insulator 914 are subjected to oxidation treatment in an oxygen atmosphere and then treatment with a silane coupling agent as in Embodiment Modes 1 to 4. Further, the surface of the first electrode 913 is made to be lyophilic as selected by light irradiation, and a silane coupling agent film 917 is formed over the insulator 914.

A layer 900 containing an organic compound and a second electrode 916 are formed over the first electrode 913, A light emitting element 915 is formed in a region where the first electrode 913, the layer 900 containing an organic compound, and the second electrode 916 overlap with one another.

The first electrode 913, the layer 900 containing an organic compound, and the second electrode 916 can be each formed using a similar material and a similar method to those in Embodiment Modes 1 to 4, and thus their explanation is omitted.

The second electrode 916 is electrically connected to an external input terminal.

Further, in FIGS. 9A and 9B, a structure is provided in which the light emitting element 915 is provided in the space 907 surrounded by the element substrate 910, the sealing substrate 904, and the sealant 905 by attaching the sealing substrate 904 to the element substrate 910 by using the sealant 905. The space 907 may be filled not only with an inert gas (e.g., nitrogen or argon) but also with the sealant 905.

An epoxy-based resin is preferably used for the sealant 905. A material used for these is desirably a material which does not transmit moisture or oxygen as possible. As a material used for the sealing substrate 904, a plastic substrate made of fiberglass-reinforced plastics (FRP), polyvinyl fluoride (PVF), polyester, acrylic, or the like can be used besides a glass substrate or a quartz substrate.

In addition, a color conversion film such as a color filter may be provided as needed.

Through the above process, a light emitting device in which a light emitting element formed over a substrate is sealed between substrates can be obtained.

As for the light emitting device which is manufactured in Embodiment Mode 5, the layer containing an organic compound of the light emitting element, sealed between the substrates, can be formed as selected more accurately than in a conventional case; thus, loss of the material can be reduced and the low cost can be achieved.

The structure shown in Embodiment Mode 5 can be freely combined with the structures shown in Embodiment Mode 1 to 3.

(Embodiment Mode 6)

In this embodiment mode, a mounting method of a driver circuit in a light emitting device which is manufactured by the present invention will be described with reference to FIGS. 10A to 10C.

Figure 10A:
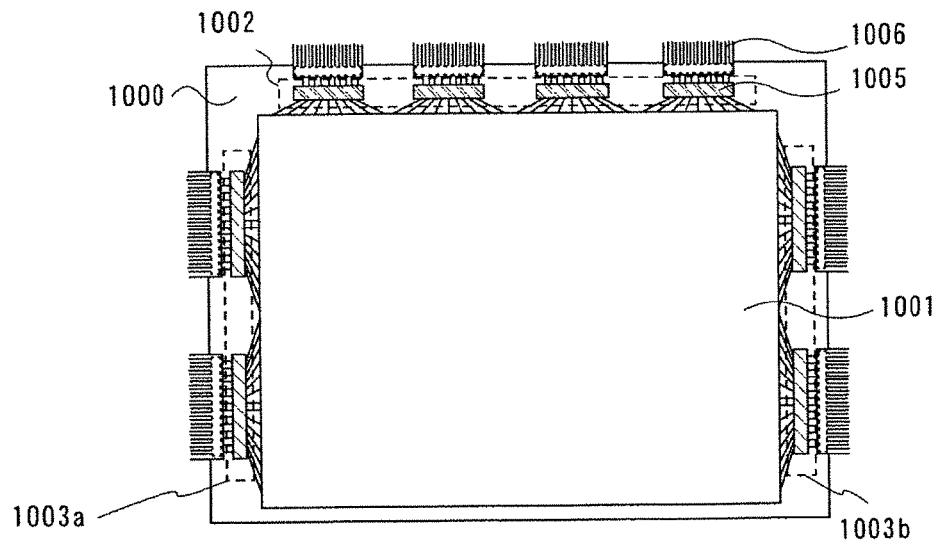
FIGS. 10A to 10C are explanatory views each showing a driver circuit mounted on a light emitting device.

As shown in FIG. 10A, a source signal line driver circuit 1002 and gate side driver circuits 1003a and 1003b are mounted in the periphery of a pixel portion 1001. That is, IC chips 1005 are mounted on a substrate 1000 by a known mounting method using an anisotropic conductive adhesive or an anisotropic conductive film, a COG method, a wire bonding method, reflow treatment using a solder bump, or the like, so that the source signal line driver circuit 1002, the gate side driver circuits 1003a and 1003b, and the like are mounted on the substrate 1000. Then, the IC chips 1005 are connected to external circuits via FPCs (flexible printed circuits) 1006.

Note that part of the source signal line driver circuit 1002, for example, an analog switch may be formed over the same substrate as the pixel portion, and the other part thereof may be mounted using the IC chip separately.

Figure 10B:
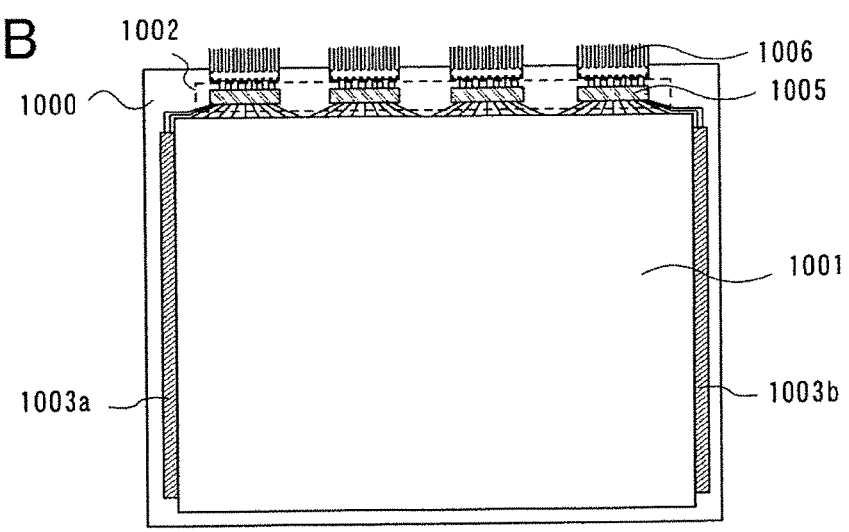

In addition, in the case of FIG. 10B, the pixel portion 1001, the gate side driver circuits 1003a and 1003b, and the like are formed over the same substrate, and the source signal line driver circuit 1002 and the like are separately mounted using the IC chips. That is, the IC chip 1005 is mounted on the substrate 1000 over which the pixel portion 1001, the gate side driver circuits 1003a and 1003b, and the like are formed, by a mounting method such as a COG method; accordingly, the source signal line driver circuit 1002 and the like are mounted. Further, the IC chip 1005 is connected to an external circuit via the FPC 1006.

Note that part of the source signal line driver circuit 1002, for example, an analog switch may be formed over the same substrate, and the other part thereof may be mounted using the IC chip separately.

Figure 10C:
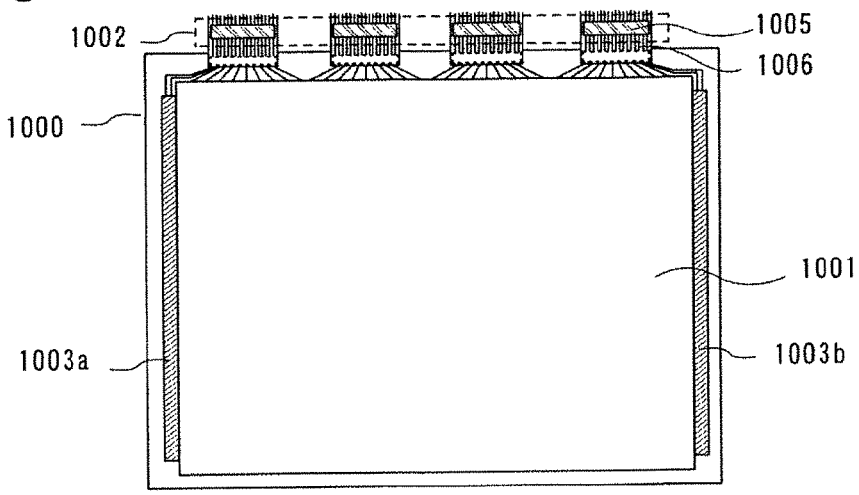

Moreover, in the case of FIG. 10C, the source signal line driver circuit 1002 and the like are mounted by a TAB method. The IC chip 1005 is connected to an external circuit via the FPC 1006. Although the source signal line driver circuit 1002 and the like are mounted by a TAB method in FIG. 10C, the gate side driver circuit and the like may be mounted by a TAB method.

When the IC chip 1005 is mounted by a TAB method, a pixel portion can be provided widely with respect to the substrate, and accordingly, a narrowed frame can be achieved.

In addition, in place of the IC chip 1005, an IC formed over a glass substrate (hereinafter referred to as a driver IC) may be provided. Since the IC chip 1005 is taken out of a circular silicon wafer, there is limitation on the shape of a mother substrate. On the other hand, a mother substrate of the driver IC is a glass substrate and there is no limitation on the shape. Thus, productivity can be improved. Therefore, the shape and the dimension of the driver IC can be freely set. For example, when the driver IC is formed to have a long side of 15 mm to 80 mm, inclusive, in length, the necessary number of the driver ICs can be reduced compared to the case of mounting the IC chip. Accordingly, the number of connection terminals can be reduced and manufacturing yield can be improved.

The driver IC can be formed using a crystalline semiconductor film formed over a substrate, and the crystalline semiconductor film may be formed by being irradiated with continuous-wave laser light. A semiconductor film formed by being irradiated with continuous-wave laser light has few crystal defects and has crystal grains each with a large grain diameter. Accordingly, a transistor having such a semiconductor film has favorable mobility and response speed, and high-speed drive thereof can be performed, which is suitable for the driver IC.

The structure shown in Embodiment Mode 6 can be freely combined with the structures shown in Embodiment Modes 1 to 5.

(Embodiment Mode 7)

In this embodiment mode, with reference to FIGS. 13A to 13E, various electronic appliances which are manufactured using a light emitting device including a light emitting element manufactured by the present invention will be described.

Examples of the electronic appliances including the light emitting device manufactured by the present invention include: television devices (also referred to as simply, televisions or television receivers), cameras such as video cameras or digital cameras, goggle displays (head mounted displays), navigation systems, audio reproducing devices (e.g., car audio component stereos and audio component stereos), notebook personal computers, game machines, portable information terminals (e.g., mobile computers, mobile phones, portable game machines, and electronic books), image reproducing devices provided with recording media (specifically, the devices that can reproduce a recording medium such as a digital versatile disc (DVD) and are provided with a display device capable of displaying the reproduced images), lighting equipment, and the like. Specific examples of these electronic appliances are shown in FIGS. 13A to 13E.

FIG. 13A shows a display device including a chassis 8001, a supporting base 8002, a display portion 8003, a speaker portion 8004, a video input terminal 8005, and the like. The light emitting device formed using the present invention can be applied to the display portion 8003. Note that the display device includes all devices for displaying information, for example, for a personal computer, for receiving TV broadcasting, and for displaying an advertisement. Since loss of a material can be reduced in the light emitting device formed using the present invention, by applying the light emitting device formed using the present invention to the display portion of the display device, the low cost of the display device can be achieved.

FIG. 13B shows a notebook personal computer including a main body 8101, a chassis 8102, a display portion 8103, a keyboard 8104, an external connection port 8105, a pointing device 8106, and the like. The light emitting device formed using the present invention can be applied to the display portion 8103. Since loss of a material can be reduced in the light emitting device formed using the present invention, by applying the light emitting device formed using the present invention to the display portion of the notebook personal computer, the low cost of the notebook personal computer can be achieved.

FIG. 13C shows a video camera including a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The light emitting device formed using the present invention can be applied to the display portion 8202. Since loss of a material can be reduced in the light emitting device formed using the present invention, by applying the light emitting device formed using the present invention to the display portion of the video camera, the low cost of the video camera can be achieved.

FIG. 13D shows a desk lamp including a lighting portion 8301, a shade 8302, an adjustable arm 8303, a support 8304, a base 8305, and a power supply switch 8306. The light emitting device formed using the present invention can be applied to the lighting portion 8301. Note that the lighting equipment includes a ceiling light, a wall light, and the like. Since loss of a material can be reduced in the light emitting device formed using the present invention, by applying the light emitting device formed using the present invention to the lighting equipment, the low cost of the lighting equipment can be achieved.

FIG. 13E shows a portable phone including a main body 8401, a chassis 8402, a display portion 8403, an audio input portion 8404, an audio output portion 8405, operation keys 8406, an external connection port 8407, an antenna 8408, and the like. The light emitting device formed using the present invention can be applied to the display portion 8403. Since loss of a material can be reduced in the light emitting device formed using the present invention, by applying the light emitting device formed using the present invention to the display portion of the portable phone, the low cost of the portable phone can be achieved.

In the above-described manner, electronic appliances using the light emitting element manufactured by a manufacturing method of the present invention can be obtained. The applicable range of the light emitting device including the light emitting element formed by the manufacturing method of the present invention is so wide that the light emitting device can be applied to electronic appliances in various fields.

The electronic appliances shown in Embodiment Mode 7 can be implemented by being freely combined with the structures shown in Embodiment Modes 1 to 6.

(Embodiment 1)

This embodiment will describe the effect of the present invention based on results of experiments.

A photocatalytic conductive film was formed with a thickness of 110 nm over a glass substrate using indium tin oxide containing silicon oxide by a sputtering method. A photosensitive acrylic resin was formed over the photocatalytic conductive film and patterned by a photolithography method, and an insulating film was formed over part of the photocatalytic conductive film.

Next, the surface of the substrate was irradiated with ultraviolet rays in an oxygen atmosphere, so that oxidation treatment was performed to the surface of the substrate.

Then, a silane coupling agent film was formed over the surface of the substrate in the treatment chamber shown in FIG. 11 described in Embodiment Mode 1. In this embodiment, heptadecafluoro-1,1,2,2-tetrahydrodecyltrimethoxysilane was used as a silane coupling agent.

Next, the surface of the silane coupling agent film was irradiated with ultraviolet rays using a metal halide lamp, so that only the silane coupling agent film over the photocatalytic conductive film was decomposed, and the surface of the photocatalytic conductive film was modified to be lyophilic. In this embodiment, treatment for modifying the surface was performed by varying light irradiation time in four ways (2 minutes, 5 minutes, 10 minutes, and 15 minutes).

The following Samples (1) to (3) were used, and contact angles of the samples on the photocatalytic conductive film and the insulating film before and after light irradiation after formation of the silane coupling agent film were measured.

Figure 14A:
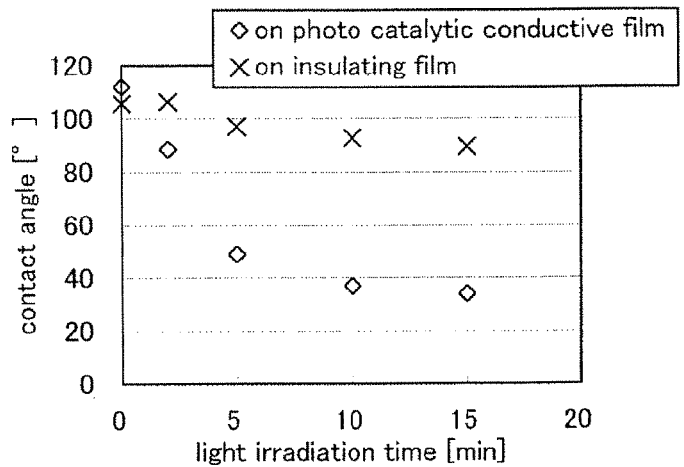
FIGS. 14A to 14C are graphs showing results of experiments in Embodiment 1.
Figure 14B:
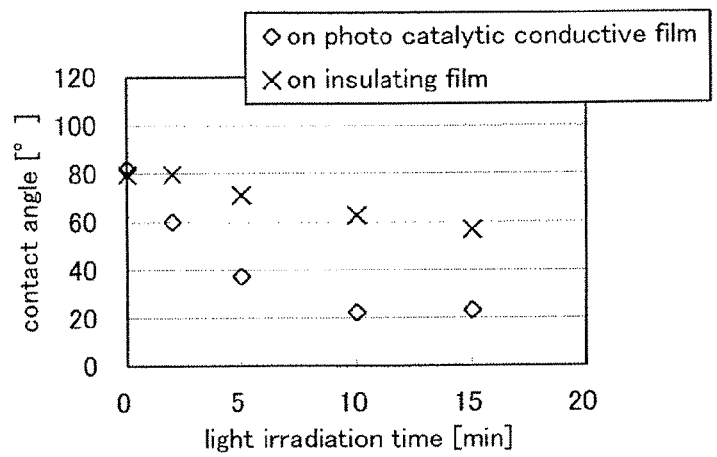
Figure 14C:
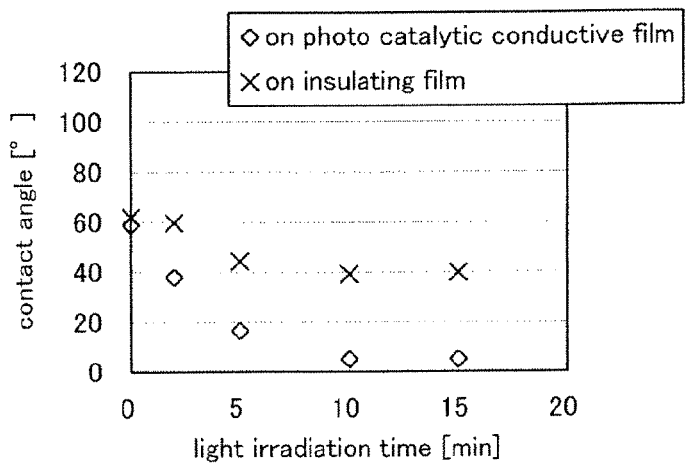

Sample (1) is pure water; Sample (2) is a mixed solution including a composition containing a polythiophene polymer (SEPLEGDYA OC-AE, manufactured by Shin-Etsu Polymer Co., Ltd.), ethylene glycol, and a surfactant (Olfine E1010, manufactured by Nissin Chemical Industry Co., Ltd.) at a ratio by weight of 1:1:0.005; and Sample (3) is a mixed solution including a composition containing a polythiophene polymer (SEPLEGDYA OC-AE, manufactured by Shin-Etsu Polymer Co., Ltd.), ethylene glycol, and a surfactant (NIKKOL BT-9, manufactured by Nikko Chemicals Co., Ltd.) at a ratio by weight of 1:1:0.005. FIGS. 14A to 14C show the results of the measurements of the contact angles, which were performed using the Samples (1) to (3).

According to the results, it is found that reduction in the contact angles is larger on the surface of the photocatalytic conductive film than on the insulating film, after light irradiation which is performed after formation of the silane coupling agent film. In addition, with the light irradiation for 5 to 15 minutes of this embodiment, the difference between the contact angle of the solution on the surface of the photocatalytic conductive film and the contact angle of the solution on the surface of the insulating film was greater than or equal to 20° in each of the Samples (1) to (3).

Regarding the Samples (2) and (3), a layer containing an organic compound was formed by an ink-jet method in the case where the contact angle of the solution on the surface of the photocatalytic conductive film which was irradiated with light after formation of the silane coupling agent film was less than or equal to 30°, and the difference between the contact angle of the solution on the surface of the photocatalytic conductive film and the contact angle of the solution on the surface of the insulating film was greater than or equal to 20°. At this time, a pattern was formed in a favorable manner only over the photocatalytic conductive film.

According to the results of this embodiment, parts having different contact angles can be formed by the present invention over the surface where the film is to be formed; thus, a pattern can be formed in a favorable manner by a droplet-discharging method such as an ink-let method.

This application is based on Japanese Patent Application Serial No. 2007-160895 filed with Japan Patent Office on Jun. 19, 2007, the entire contents of which are hereby incorporated by reference.

What is claimed is:

1. A light emitting device comprising:
   a thin film transistor over a substrate;
   a photocatalytic conductive film electrically connected to the thin film transistor;
   an insulating film covering an end portion of the photocatalytic conductive film;
   a silane coupling agent film over the insulating film;
   a layer containing an organic compound over and in contact with the photocatalytic conductive film; and
   a conductive film over the silane coupling agent film and the layer containing the organic compound, and
   wherein a side surface of the insulating film is covered by the silane coupling agent film,
   wherein the silane coupling agent film is in contact with an upper portion of the insulating film,
   wherein the photocatalytic conductive film and the conductive film both have a light-transmitting property, and wherein a reflective film or a light-blocking film are provided for the photocatalytic conductive film on a side opposite to the conductive film.

2. The light emitting device according to claim 1, wherein the photocatalytic conductive film includes indium tin oxide, indium zinc oxide which is obtained by mixing zinc oxide of greater than or equal to 2% and less than or equal to 20% into indium oxide, indium tin oxide containing silicon oxide as a constituent, indium oxide doped with tin, zinc oxide, zinc oxide doped with aluminum, zinc oxide doped with gallium, titanium oxide, or tin oxide.

3. The light emitting device according to claim 1, wherein the silane coupling agent film includes fluoroalkylsilane represented by a chemical formula $R_n$—Si—$X_{(4-n)}$; and
wherein n is 1 to 3, X represents a hydrolyzable group, and R represents a fluoroalkyl group in the chemical formula.

4. The light emitting device according to claim 1, wherein the layer containing the organic compound includes a light emitting substance.

5. A light emitting device comprising:
a thin film transistor over a substrate;
a photocatalytic conductive film electrically connected to the thin film transistor;
an insulating film covering an end portion of the photocatalytic conductive film;
a silane coupling agent film over the insulating film;
a layer containing an organic compound over and in contact with the photocatalytic conductive film; and
a conductive film over the silane coupling agent film and the layer containing the organic compound,
wherein the photocatalytic conductive film is electrically connected to one of source or drain of the thin film transistor,
wherein a side surface of the insulating film is covered by the silane coupling agent film, and
wherein the silane coupling agent film is in contact with a upper portion of the insulating film,
wherein the photocatalytic conductive film and the conductive film both have a light-transmitting property, and
wherein a reflective film or a light-blocking film are provided for the photocatalytic conductive film on a side opposite to the conductive film.

6. The light emitting device according to claim 5, wherein the photocatalytic conductive film includes indium tin oxide, indium zinc oxide which is obtained by mixing zinc oxide of greater than or equal to 2% and less than or equal to 20% into indium oxide, indium tin oxide containing silicon oxide as a constituent, indium oxide doped with tin, zinc oxide, zinc oxide doped with aluminum, zinc oxide doped with gallium, titanium oxide, or tin oxide.

7. The light emitting device according to claim 5,
wherein the silane coupling agent film includes fluoroalkylsilane represented by a chemical formula $R_n$—Si—$X_{(4-n)}$; and
wherein n is 1 to 3, X represents a hydrolyzable group, and R represents a fluoroalkyl group in the chemical formula.

8. The light emitting device according to claim 5, wherein the layer containing the organic compound includes a light emitting substance.

9. A light emitting device comprising:
a photocatalytic conductive film over a substrate;
an insulating film covering an end portion of the photocatalytic conductive film;
a silane coupling agent film over the insulating film;
a layer containing an organic compound over and in contact with the photocatalytic conductive film; and
a conductive film over the silane coupling agent film and the layer containing the organic compound,
wherein a side surface of the insulating film is covered by the silane coupling agent film. and
wherein the silane coupling agent film is in contact with a upper portion of the insulating film,
wherein the photocatalytic conductive film and the conductive film both have a light-transmitting property, and
wherein a reflective film or a light-blocking film are provided for the photocatalytic conductive film on a side opposite to the conductive film.

10. The light emitting device according to claim 9, wherein the photocatalytic conductive film includes indium tin oxide, indium zinc oxide which is obtained by mixing zinc oxide of greater than or equal to 2% and less than or equal to 20% into indium oxide, indium tin oxide containing silicon oxide as a constituent, indium oxide doped with tin, zinc oxide, zinc oxide doped with aluminum, zinc oxide doped with gallium, titanium oxide, or tin oxide.

11. The light emitting device according to claim 9,
wherein the silane coupling agent film includes fluoroalkylsilane represented by a chemical formula $R_n$—Si—$X_{(4-n)}$; and
wherein n is 1 to 3, X represents a hydrolyzable group, and R represents a fluoroalkyl group in the chemical formula.

12. The light emitting device according to claim 9, wherein the layer containing the organic compound includes a light emitting substance.

13. A light emitting device comprising:
a photocatalytic conductive film over a substrate;
an insulating film covering an end portion of the photocatalytic conductive film;
a silane coupling agent film over the insulating film;
a layer containing an organic compound over and in contact with the photocatalytic conductive film; and
a conductive film over the silane coupling agent film and the layer containing the organic compound,
wherein the photocatalytic conductive film is electrically connected to the layer containing the organic compound,
wherein a side surface of the insulating film is covered by the silane coupling agent film, and
wherein the silane coupling agent film is in contact with a upper portion of the insulating film,
wherein the photocatalytic conductive film and the conductive film both have a light-transmitting property, and
wherein a reflective film or a light-blocking film are provided for the photocatalytic conductive film on a side opposite to the conductive film.

14. The light emitting device according to claim 13, wherein the photocatalytic conductive film includes indium tin oxide, indium zinc oxide which is obtained by mixing zinc oxide of greater than or equal to 2% and less than or equal to 20% into indium oxide, indium tin oxide containing silicon oxide as a constituent, indium oxide doped with tin, zinc oxide, zinc oxide doped with aluminum, zinc oxide doped with gallium, titanium oxide, or tin oxide.

15. The light emitting device according to claim 13,
wherein the silane coupling agent film includes fluoroalkylsilane represented by a chemical formula $R_n$—Si—$X_{(4-n)}$; and wherein n is 1 to 3, X represents a hydrolyzable group, and R represents a fluoroalkyl group in the chemical formula.

16. The light emitting device according to claim 13, wherein the layer containing the organic compound includes a light emitting substance.

17. The light emitting device according to claim 1,
wherein the layer comprises a tapered portion, and
wherein the insulating film is in contact with the end portion of the photocatalytic conductive film.

18. The light emitting device according to claim 1, wherein the insulating film is a single layer.

19. The light emitting device according to claim 1, wherein the insulating film is essentially consisting of one material selected from an inorganic material and an organic material.

* * * * *